United States Patent [19]
Anami et al.

[11] Patent Number: 5,555,522
[45] Date of Patent: Sep. 10, 1996

[54] SEMICONDUCTOR MEMORY HAVING REDUNDANT CELLS

[75] Inventors: Kenji Anami; Shigeki Ohbayashi; Osamu Inoue, all of Hyogo, Japan

[73] Assignee: Mitsubishi Denki Kabushiki Kaisha, Tokyo, Japan

[21] Appl. No.: 434,442

[22] Filed: May 3, 1995

[30] Foreign Application Priority Data

May 20, 1994 [JP] Japan ................................. 6-107123

[51] Int. Cl.$^6$ ........................... G11C 7/00; G11C 8/00
[52] U.S. Cl. .................. 365/200; 365/201; 365/230.02; 365/230.08
[58] Field of Search ............................... 365/200, 201, 365/230.08, 230.02

[56] References Cited

U.S. PATENT DOCUMENTS

| | | | |
|---|---|---|---|
| 4,451,903 | 5/1984 | Jordan | 365/201 |
| 4,480,199 | 10/1984 | Varshney et al. | 365/200 |
| 4,780,851 | 10/1988 | Kurakami | 365/200 |
| 4,829,480 | 5/1989 | Seo | 365/200 |
| 4,895,899 | 6/1990 | Morigami | 365/200 |
| 4,984,205 | 1/1991 | Sugibayashi | 365/200 |
| 5,008,857 | 4/1991 | Mizoguchi | 365/200 |
| 5,233,566 | 8/1993 | Imamiya et al. | 365/200 |
| 5,255,227 | 10/1993 | Haeffele | 365/200 |
| 5,383,156 | 1/1995 | Komatsu | 365/200 |

FOREIGN PATENT DOCUMENTS

| | | |
|---|---|---|
| 61-158098 | 7/1986 | Japan . |
| 61-35636 | 8/1986 | Japan . |
| 63-37898 | 2/1988 | Japan . |
| 2-41117 | 9/1990 | Japan . |
| 3-22298 | 1/1991 | Japan . |
| 5-41099 | 2/1993 | Japan . |

OTHER PUBLICATIONS

"A Fast 8K×8 Mixed CMOS Static RAM", IEEE Transactions on Electron Devices, vol. ED–32, No. 9, Sep. 1985.
"A 7–NS 1–MB BICMOS ECL SRAM with Shift Redundancy", IEEE Journal of Solid–State Circuits, vol. 26, No. 4, Apr. 1991.

*Primary Examiner*—David C. Nelms
*Assistant Examiner*—Trong Phan
*Attorney, Agent, or Firm*—Lowe, Price, LeBlanc & Becker

[57] ABSTRACT

A semiconductor memory comprising a flip-flop circuit, a redundant memory cell row and column, a specific address detecting gate, a transistor, a sense amplifier and a data output buffer. The receipt of a supply potential causes the flip-flop circuit to generate previously stored output status representing the use or the nonuse of the redundant memory cell row and column. Upon detection of a specific address by the specific address detecting gate, the transistor effects a switching operation causing the output status generated by the flip-flop circuit to be output to the outside via the transistor, sense amplifier and data output buffer. This allows the use or the nonuse of the redundant bits to be verified efficiently.

24 Claims, 22 Drawing Sheets

SEMICONDUCTOR MEMORY HAVING REDUNDANT CELLS

BACKGROUND OF THE INVENTION

1. Field of the Invention

The present invention relates to a semiconductor memory having redundant cells. More particularly, the invention relates to a semiconductor memory capable of being verified for the use or the nonuse of redundant cells therein.

2. Description of the Related Art

Semiconductor memories generally include redundant bits illustratively composed of redundant memory cell rows and columns. These redundant bits are provided to compensate for faulty bits in the semiconductor memories while maintaining high levels of yield of their fabrication.

Such semiconductor memories having redundant bits are generally tested for the use or the nonuse of redundant bits therein.

FIG. 30 is a circuit diagram of a redundant bit usage test circuit for use with a conventional semiconductor memory. The circuit of FIG. 30 is what is disclosed in Japanese Patent Publication No. Hei 2-41117.

Referring to FIG. 30, an input terminal 401 receives as a test signal a potential higher than a supply voltage VCC. A supply potential line 404 is fed with the supply potential VCC. A plurality of MOSFET diodes 402 and a fuse 403 are connected in a serial and interposing manner between the input terminal 401 and the supply potential line 404. The fuse 403 blows if any redundant bit is used.

The circuit of FIG. 30 works as follows: when the semiconductor memory is tested for the use or the nonuse of any redundant bit therein, the input terminal 401 receives a potential higher than the supply potential VCC. Then a check is made to see if a current flows through the fuse 403.

When a potential higher than the supply potential VCC is added to the input terminal 401, the multiple MOSFET diodes 402 are turned on each.

If no redundant bit is used, the fuse 403 remains intact and allows a current to flow therethrough. If any redundant bit has been used, the fuse 403 has blown and no current flows through it.

The test checks to see if any current flows through the fuse 403. The result of the test indicates whether or not any redundant bit has been used.

What follows is a description of another conventional semiconductor memory verifiable for the use or the nonuse of redundant bits therein.

FIG. 31 is a block diagram of a conventional semiconductor memory capable of being verified for the use or the nonuse of redundant bits therein. The semiconductor memory of FIG. 31 is what is disclosed in "A Fast 8K×8 Mixed CMOS Static RAM," IEEE Transactions on Electron Devices, Vol. ED-32, No. 9, September 1985.

Referring to FIG. 31, the semiconductor memory comprises a memory cell array 2, a redundant memory cell column 4, a row address buffer 11, a row decoder 12, a column address buffer 13, a column decoder 14, a multiplexer 15, a redundancy program circuit 17b, a redundant column decoder 18b, a redundancy multiplexer 19, a control circuit 66 and an input/output data buffer 600.

The memory cell array 2 includes a plurality of memory cells 20 arranged in matrix fashion. The redundant memory cell column 4 comprises a plurality of redundant memory cells 40 which constitute a column structure.

The row address buffer 11 receives a row address signal A0-An, amplifies the received signal, rectifies the amplified signal in waveform, and outputs the waveform-rectified signal. The row decoder 12 receives the output signal from the row address buffer 11, decodes the signal, and activates a memory cell row in the memory cell array 2 accordingly. This selects the appropriate memory cell row of the memory cell array 2.

The column address buffer 13 receives a column address signal B0-Bm, amplifies the received signal, rectifies the amplified signal in waveform, and outputs the waveform-rectified signal. The column decoder 14 receives the output signal from the column address buffer 13, decodes the signal, and supplies the decoded result to the multiplexer 15.

At the time of writing data, the multiplexer 15 selects a memory cell column in the memory cell array 2 in response to the output signal from the column decoder 14. The selected memory cell column is fed with write data from the input/output data buffer 600.

At the time of reading data, the multiplexer 15 selects a memory cell column in the memory cell array 2 in response to the output signal from the column decoder 14. The data is then read from the selected memory cell and given to the input/output data buffer 600.

In the redundancy program circuit 17b, the column address representing the column replaced by the redundant memory cell column 4 is programmed. In operation, the redundancy program circuit 17b receives a column address signal from the column address buffer 13. If the column address of the signal coincides with any column address programmed in the redundancy program circuit 17b, the circuit 17b generates a signal for inactivating the column decoder 14 and a signal for activating the redundant column decoder 18b.

The column decoder 14 is inactivated upon receipt of the signal from the redundancy program circuit 17b. The redundant column decoder 18b receives not only the signal from the redundancy program circuit 17b but also a test mode signal TE. The test mode signal is a signal that is activated in a test mode for testing the semiconductor memory for the use or the nonuse of redundant bits therein such as the redundant memory cell column 4.

The redundant column decoder 18b is activated in response to the signal from the redundancy program circuit 17b, and is inactivated upon receipt of the test mode signal TE. When activated, the redundant column decoder 18b supplies the redundancy multiplexer 19 with a signal for selecting a redundant memory cell column 4.

When data is to be written, the redundancy multiplexer 19 selects a redundant memory cell column 4 in response to the output signal from the redundant column decoder 18b. The selected redundant memory cell column 4 is fed with write data from the input/output data buffer 600. When data is to be read, the redundancy multiplexer 19 selects a redundant memory cell column 4 in response to the output signal from the redundant column decoder 18b. The data is read from the selected redundant memory cell column 4 and sent to the input/output data buffer 600.

The control circuit 66 receives a read/write control signal WE and outputs accordingly a control signal for controlling the input/output data buffer 600. The input/output data buffer 600 amplifies and otherwise handles a data input signal DI and a data output signal DO for a write and a read operation, respectively.

The input/output data buffer 600 receives the control signal from the control circuit 66. In response, the input/ output data buffer 600 admits the data input signal DI or outputs the data output signal DO selectively.

More specifically, the input/output data buffer 600 sends the data input signal DI to the multiplexer 15 and redundancy multiplexer 19 for a read operation. The input/output data buffer 600 outputs the data write signal DO for a write operation to the outside.

Described below is how the semiconductor memory of FIG. 31 works in normal and in test mode.

(1) In normal mode

The memory cell row corresponding to a row address is selected as follows: the row address is first amplified and then waveform-rectified by the row address buffer 11. A row address signal from the row address buffer 11 is decoded by the row decoder 12. In turn, the row decoder 12 selects the appropriate memory cell row in the memory cell array 2.

The memory cell column corresponding to a column address is selected as follows: the column address B0-Bm is first amplified and then waveform-rectified by the column address buffer 13.

If the redundant memory cell column 4 has been used, the column decoder 14 and multiplexer 15 first select the corresponding memory cell column in the memory cell array 2. Then the redundant column decoder 18*b* and redundancy multiplexer 19 select the applicable redundant memory cell column 4.

It may happen that the column address of the column address signal from the column address buffer 13 fails to coincide with the column address programmed in the redundancy program circuit 17*b*. In that case, the output signal from the redundancy program circuit 17*b* activates the output signal of the column decoder 14 and inactivates the output signal of the redundant column decoder 18*b*.

In the case above, the column address signal from the column address buffer 13 is decoded by the column decoder 14. The output signal from the Column decoder 14 causes the multiplexer 15 to select the appropriate memory cell column in the memory cell array 2.

It may also happen that the column address of the column address signal from the column address buffer 13 coincides with the column address programmed in the redundancy program circuit 17*b*. In that case, the output signal from the redundancy program circuit 17*b* inactivates the output signal of the column decoder 14 and activates the output signal of the redundant column decoder 18*b*.

In the latter case, the output signal from the redundant column decoder 18*b* causes the redundancy multiplexer 19 to select the redundant memory cell column 4.

If the redundant memory cell column 4 has not been used, memory cell columns in the memory cell array 2 alone are selected by the column decoder 14 and multiplexer 15.

The memory cell thus designated by the selected row and column is subject to the data read or write operation.

When data is to be written, the read/write control signal WE is set for data write mode. On receiving the signal WE, the control signal 66 places the input/output data buffer 600 in data write mode. The data input signal DI is then written to the memory cell 20 via the reversed route of the read operation.

(2) In test mode

In test ode, the test mode signal TE is activated. This inactivates the redundant column decoder 18*b*, which in turn inactivates the redundancy multiplexer 19. As a result, the redundant memory column 4 is inhibited from being accessed for the write or read operation. Thus if the column address selected for a read operation represents the redundant memory cell column 4 replacing a memory cell column in the memory cell array 2, the read-out data is unpredictable.

In test mode, predetermined information is written beforehand to each of the addresses. The information is then retrieved from each address to verify whether or not the redundant memory cell column 4 has been used.

Where the predetermined information is retrieved from a column address, it may happen that column address represents the memory cell column replaced by the redundant memory cell column 4. In that case, the retrieved information is unpredictable. If the selected column address represents a memory cell column not replaced by the redundant memory cell column 4, the same predetermined information as that written beforehand is retrieved therefrom.

The use or the nonuse of the redundant memory cell column 4 is determined by whether or not the retrieved information coincides with the information previously written. A mismatch between the retrieved information and the already written information indicates that the memory cell column of the column address in question has been replaced by the redundant memory cell column 4.

Under such conventional schemes by which to check whether or not the redundant memory cell 4 is used, it is necessary to write and read the predetermined information to and from each address at least twice to make sure that the result of the check is correct. Writing and reading the information only once is not enough to ascertain that the retrieved information is not unpredictable information.

The conventional semiconductor memories exemplified by what is shown in FIGS. 30 and 31 have the following disadvantages:

The semiconductor memory having the test circuit of FIG. 30 requires generating a high voltage when the use or the nonuse of any redundant bits is verified. The voltage to be generated needs to be considerably high.

The reason for the high voltage is as follows: the threshold voltages of the MOSFET diodes 402 can be diverse depending on the fabrication process. To ensure that the test circuit functions normally requires that the disparate threshold voltages are to be exceeded by an appreciably high voltage.

Applying such a high voltage to the MOSFET diodes 402 produces a high voltage between their gates and the substrate. This can result in destruction of a gate insulating film.

Furthermore, the conventional redundant bit-usage test circuit exemplified by that of FIG. 30 needs dedicated signals for testing the high voltage and other aspects of operation. This means that the check on whether or not redundant bits are used cannot be performed efficiently.

The semiconductor memory of FIG. 31 requires repeating write and read operations repeatedly in test mode in order to make sure that the result of the check on the use or the nonuse of redundant bits is correct. It thus takes considerable time to ascertain the result of the check. This also means that the check on whether or not redundant bits are used cannot be performed efficiently.

SUMMARY OF THE INVENTION

It is therefore an object of the present invention to provide a semiconductor memory capable of being verified efficiently for the use or the nonuse of redundant bits therein.

It is another object of the invention to provide a semiconductor memory capable of being verified for the use or the nonuse of redundant bits therein without having recourse to dedicated test signals such as a high voltage or a test mode signal furnished from the outside.

It is a further object of the invention to provide a semiconductor memory capable of being verified for the use or the nonuse of redundant bits therein over a shorter period of time than before.

In carrying out the invention and according to one aspect thereof, there is provided a semiconductor memory comprising a memory cell array, either a redundant memory cell row or a redundant memory cell column, specific address detecting means, power supply nodes, a status storing means, and switching means.

The memory cell array has a plurality of memory cells arranged in matrix fashion. The redundant memory cell row or column replaces respectively any one memory cell row or column in the memory cell array.

The specific address detecting means detects the selection of a specific address in the memory cell array and generates a detection signal upon the detection. The power supply nodes receive a supply potential.

The status storing means stores beforehand output status representing either the use or the nonuse of the redundant memory cell row or column, and generates the stored output status in response to the receipt of the supply potential.

The switching means performs a switching operation, in response to the detection signal from the specific address detecting means, to output the output status generated by the status storing means when the specific address is selected. The output status serves as information indicating either the use or the nonuse of the redundant memory cell row or column.

In operation, the supply potential is received first. The receipt of the supply potential prompts the status storing means to generate the previously stored output status. The output status represents the use or the nonuse of the redundant memory cell row or column.

When the specific address detecting means detects the selection of a specific address, the switching means performs a switching operation to output the output status generated by the status storing means. The output constitutes information indicating the use or the nonuse of the redundant memory cell row or column.

In this manner, when a specific address is selected following the application of the supply potential, there is output the information indicating the use or the nonuse of the redundant memory cell row or column.

This means that whether or not the redundant bits are used can be verified without recourse to a dedicated test signal such as a high voltage or a test mode signal furnished from the outside. Simply selecting a specific address for a read operation makes it possible to check if the redundant bits are used. The use or the nonuse of the redundant bits is thus ascertained efficiently.

In a preferred structure according to the invention, the status storing means includes fuse means for receiving the supply potential. With this structure, the status storing means stores output status representing either the use or the nonuse of the redundant memory cell row and/or the redundant memory cell column depending on whether the fuse means has blown. The status storing means then outputs the stored output status in response to the receipt of the supply potential.

With the preferred structure above, the output status of the status storing means is stored so as to reflect whether or not the fuse means has blown. Thus the output status of the status storing means can be set depending on the fuse means having blown or not.

In another preferred structure according to the invention, the status storing means stores first output status representing the use of the redundant memory cell row and/or the redundant memory cell column if the fuse means has blown, and stores second output status representing the nonuse of the redundant memory cell row and/or the redundant memory cell column if the fuse means remains intact.

With this structure, the type of the stored output status of the status storing means is determined depending on whether or not the fuse means has blown. All that needs to be done is to cause the fuse means to blow when the redundant memory cell row and/or column is used. This simplifies the procedures for having the status storing means store its output status.

In a further preferred structure according to the invention, the semiconductor memory further comprises word lines furnished to the memory cell array, a row decoder for outputting a signal for selecting a row address in the memory array, and a column decoder for outputting a signal for selecting a column address in the memory array. The specific address detecting means receives the output signal of the row decoder via a signal line independent of the word lines, receives the output signal of the column decoder, and checks to see if a specific address is selected on the basis of the received signals.

With this preferred structure, the output signal of the row decoder destined to the specific address detecting means arrives there through a route independent of the word lines. This arrangement allows a specific address to be detected more rapidly than the conventional setup in which the output signal of the row decoder is received over the word lines. In this manner, the check on whether or not the redundant memory cell and column are used is accomplished faster than ever.

According to another aspect of the invention, there is provided a semiconductor memory comprising a memory cell array, a redundant memory cell row and a redundant memory cell column, a plurality of specific address detecting means, power supply nodes, a plurality of status storing means, and a plurality of switching means.

The memory cell array has a plurality of memory cells arranged in matrix fashion. The redundant memory cell row and the redundant memory cell column replace respectively any one memory cell row and any one memory cell column in the memory cell array.

The multiple specific address detecting means are associated respectively with specific addresses in the memory cell array. Each of the specific address detecting means detects the selection of one of the specific addresses and generates a detection signal upon the detection.

The power supply nodes receive the supply potential. The multiple status storing means are associated respectively with the multiple specific address detecting means. Each of the status storing means stores output status representing the usage status of the redundant memory cell row and column, and generates the stored output status in response to the receipt of the supply potential.

The multiple switching means are associated respectively with the multiple status storing means. Each of the switching means performs a switching operation, in response to the detection signal from the corresponding specific address detecting means, to output the output status generated by the corresponding status storing means when the corresponding specific address is selected. The output status serves as information indicating the usage status of the redundant memory cell row and column.

With this structure in operation, the receipt of the supply potential prompts each of the status storing means to generate the previously stored output status. This output status represents usage status of the redundant memory cell row and column. The usage status indicates illustratively whether or not the redundant memory cell row and column have replaced any memory cell row and column of the memory cell array.

When each of the multiple specific address detecting means detects the corresponding specific address, the corresponding switching means carries out its switching operation to output the output status generated by the corresponding status storing means. The status thus output constitutes information indicating the usage status of the redundant memory cell row and column.

With each specific address selected for a read operation following the receipt of the supply potential, there is output the information representing the usage status of the redundant memory cell row and column with respect to the selected address.

With the above structure, when the usage status of the redundant memory cell row and column is to be verified, there is no need for a dedicated test signal such as a high voltage or a test mode signal to be furnished from the outside. Simply selecting any of the specific addresses makes it possible to verify the usage status of the redundant memory cell row and column. The use or the nonuse of the redundant memory cell row and column is thus ascertained efficiently.

In a preferred structure according to the invention, each of the status storing means includes fuse means for receiving the supply potential, stores output status representing the usage status of the redundant memory cell row and column depending on whether the fuse means has blown, and outputs the stored output status in response to the receipt of the supply potential.

With this preferred structure, the output status of each of the status storing means is set depending on whether the fuse means has blown. In other words, it is possible to store the output status representing the usage status of the redundant row and column in accordance with whether or not the fuse means has blown.

According to a further aspect of the invention, there is provided a semiconductor memory comprising power supply nodes for receiving a supply potential, a redundant memory cell row and a redundant memory cell column, and a memory cell array including a memory cell at a specific address at which to store information about the use or the nonuse of the redundant memory cell and column.

The memory cell at the specific address has fuse means for receiving the supply potential, stores output status representing either the use or the nonuse of any redundant memory cells depending on whether the fuse means has blown, and outputs the stored output status in response to the receipt of the supply potential.

With this structure in operation, the receipt of the supply potential generates the previously stored output status in the memory cell at the specific address. The output status corresponds to the use or the nonuse of the redundant memory cell row and column. The output status is stored in accordance with whether or not the fuse means has blown.

The memory cell at the specific address constitutes part of the memory cell array. Thus when that specific address is selected, the output status generated in the memory cell of the selected address is output.

With the above structure, when the use or the nonuse of the redundant memory cell row and column is to be verified, there is no need for a dedicated test signal such as a high voltage or a test mode signal to be furnished from the outside. Simply selecting the memory cell at the specific address makes it possible to verify the use or the nonuse of the redundant memory cell row and column. The usage status of the redundant memory cell row and column is thus ascertained efficiently.

The memory cell at the specific address, constituting part of the memory cell array, generates the output status reflecting the use or the nonuse of the redundant memory cell row and column. The structure eliminates the need for providing the means to generate such output status outside the memory cell array. This in turn simplifies the constitution of the circuit for ascertaining the use or the nonuse o the redundant memory cell row and column.

According to an even further aspect of the invention, there is provided a semiconductor memory comprising a memory cell array, a redundant memory cell column, a test mode memory cell row, and a test mode row decoder.

The memory cell array has a plurality of memory cells arranged in matrix fashion. The redundant memory cell column replaces the memory cell column represented by any column address in the memory cell array.

The test mode memory cell row is composed of a plurality of test memory cells associated respectively with the memory cell columns of the memory cell array and with the redundant memory cell column. The test mode memory cell row has one kind of information stored beforehand in the test memory cell associated with the redundant memory cell column, and has another kind of information stored beforehand in each of the test memory cells associated with each column of the memory cell array.

The test mode row decoder receives a test mode signal representing a test mode, and selects the test mode memory cell row in response to the test mode signal received in the test mode.

In the test mode, the column addresses of the memory cell array are selected by turns in order to retrieve the information stored in the test memory cells of the test mode memory cell row to check if the redundant memory cell column has replaced any memory cell column.

With this structure in the test mode, receiving the test mode signal causes the test mode row decoder to select only the test mode memory cell row in the row direction, and the column addresses by turns in the column direction.

Thus in the test mode, the stored information is retrieved from each test memory cell associated with each of the column addresses, each test memory cell being selected from among the test memory cells constituting the test mode memory cell row.

In the setup above, there exist the column addresses representing the columns not replaced by the redundant memory cell column. For these column addresses, the stored information is retrieved from each test memory cell associated with each of the columns in the memory cell array. For the column address of the column replaced by the redundant memory cell column, the stored information is retrieved from the test memory cell associated with the redundant memory cell column.

The test mode memory cell row has one kind of information previously stored in the test memory cell associated with the redundant memory cell column, and has another kind of information previously stored in each of the test memory cells associated with each column of the memory cell array. It follows that the stored information retrieved in the test mode from the column address of the column replaced by the redundant memory cell column differs from the other stored information.

Thus in the test mode, the retrieved information provides the basis for verifying whether or not the redundant memory cell column has been used. In this case, it is also possible to ascertain the column address of the column replaced by the redundant memory cell column.

With this structure, simply carrying out the test once makes it possible to verify the use or the nonuse of the redundant memory cell column. Thus the usage status of the redundant memory cell column is checked more quickly than before and with higher efficiency.

In a preferred structure according to the invention, the above semiconductor memory further comprises power supply nodes for receiving a supply potential, and grounding nodes for receiving a grounding potential.

With this preferred structure, each of the memory cells in the memory cell array includes a first and a second storage node, a first and a second driver transistor, and first and second load means. The multiple test memory cells are constituted by first test memory cells storing first information and by a second test memory cell storing second information different from the first information.

Each of the first and the second test memory cells includes a third and a fourth storage node, a third and a fourth driver transistor, and third and fourth load means.

With the memory cells in the memory array, the first driver transistor has its gate connected to the second storage node, the first driving transistor being connected interposingly between the first storage node and the grounding nodes. The second driver transistor has its gate connected to the first storage node, the second driving transistor being connected interposingly between the second storage node and the grounding nodes. The first load means is connected interposingly between the first storage node and the power supply nodes, and the second load means is connected interposingly between the second storage node and the power supply nodes.

With the first and the second test memory cells, the third driver transistor has its gate connected to one of the third and the fourth storage node, the third driver transistor being connected interposingly between the other of the third and the fourth storage node on the one hand, and the grounding nodes on the other. The third load means is connected interposingly between the third storage node and the power supply nodes, and the fourth load means is connected interposingly between the fourth storage node and the power supply nodes.

With this preferred structure, the way in which the third driver transistor of each of the first test memory cells is connected to the third and the fourth storage node differs from the way in which the third driver transistor of the second test memory cell is connected to the third and the fourth storage node.

In the preferred constitution above, each of the first and the second test memory cells is constituted by one driver transistor and two load means.

These test memory cells constitute a modified part of the memory cells in the memory cell array. Thus each of the test memory cells has the same area as each memory cell in the memory cell array.

Each memory cell is designed to have a minimum area. Where the test mode memory cell row and column comprise the test memory cells each having the same area as each of the memory cells, the increase in the whole cell area is minimized. This makes it possible to minimize that increase in the circuit area which is attributable to the furnished test memory cells.

In another preferred structure according to the invention, the above semiconductor memory further comprises power supply nodes for receiving a supply potential, and grounding nodes for receiving a grounding potential.

Each of the memory cells in the memory cell array includes a first and a second storage node, a first and a second driver transistor, and first ad second load means. The multiple test memory cells are constituted by first test memory cells storing first information and by a second test memory cell storing second information different from the first information.

Each of the first and the second test memory cells includes a third and a fourth storage node, a third and a fourth driver transistor, and third load means.

For each of the memory cells in the memory cell array, the first driver transistor has its gate connected to the second storage node, the first driving transistor being connected interposingly between the first storage node and the grounding nodes. The second driver transistor has its gate connected to the first storage node, the second driving transistor being connected interposingly between the second storage node and the grounding nodes. The first load means is connected interposingly between the first storage node and the power supply nodes, and the second load means is connected interposingly between the second storage node and the power supply nodes.

For each of the first and the second test memory cells, the third driver transistor has its gate connected to the fourth storage node, the third driver transistor being connected interposingly between the third storage node and the grounding nodes. The fourth driver transistor has its gate connected to the third storage node, the fourth driver transistor being connected interposingly between the fourth storage node and the grounding nodes. The third load means is connected interposingly between one of the third and the fourth storage node on the one hand, and the power supply nodes on the other.

The way in which the third load means of each of the first test memory cells is connected to the third and the fourth storage node differs from the way in which the third load means of the second test memory cell is connected to the third and the fourth storage node.

With the above preferred structure, each of the first and the second test memory cells is composed of two driver transistors and one load means.

These test memory cells constitute a modified part of the memory cells in the memory cell array. Thus each of the test memory cells has the same area as each memory cell in the memory cell array.

Each memory cell is designed to have a minimum area. Where the test mode memory cell row and column comprise the test memory cells each having the same area as each of the memory cells, any increase in the whole cell area is minimized. This makes it possible to minimize that increase in the circuit area which is attributable to the furnished test memory cells.

According to a still further aspect of the invention, there is provided a semiconductor memory comprising a memory cell array, a redundant memory cell row, a test mode memory cell column, and a test mode multiplexer.

The memory cell array has a plurality of memory cells arranged in matrix fashion. The redundant memory cell row replaces the memory cell row of any row address in the memory cell array.

The test mode memory cell column is composed of a plurality of test memory cells associated respectively with the memory cell rows in the memory cell array and with the redundant memory cell row. The test mode memory cell column has one kind of information stored beforehand in the test memory cell associated with the redundant memory cell row, and has another kind of information stored beforehand in each of the test mode memory cells associated with each row of the memory cell array.

The test mode multiplexer receives a test mode signal representing a test mode, and selects the test mode memory cell column in response to the test mode signal received in the test mode.

In the test mode, the row addresses of the memory cell array are selected by turns in order to retrieve the information stored in the test mode memory cells of the test mode memory cell column to check if the redundant memory cell row has replaced any memory cell row.

With this structure in the test mode, receiving the test mode signal causes the test mode multiplexer to select only the test mode memory cell column in the column direction, and the row addresses by turns in the row direction.

Thus in the test mode, the stored information is retrieved from each test mode memory cell associated with each of the row addresses, each test mode memory cell being selected from among the test mode memory cells constituting the test mode memory cell column.

In the setup above, there exist the row addresses representing the rows not replaced by the redundant memory cell row. For these row addresses, the stored information is retrieved from each test mode memory cell associated with each of the rows in the memory cell array. For the row address of the row replaced by the redundant memory cell row, the stored information is retrieved from the test memory cell associated with the redundant memory cell row.

The test mode memory cell column has one kind of information previously stored in the test memory cell associated with the redundant memory cell row, and has another kind of information previously stored in each of the test memory cells associated with each row of the memory cell array. It follows that the stored information retrieved in the test mode from the row address of the row replaced by the redundant memory cell row differs from the other stored information.

Thus in the test mode, the retrieved information provides the basis for verifying whether or not the redundant memory cell row has been used. In this case, it is also possible to ascertain the row address of the row replaced by the redundant memory cell row.

With this structure, simply carrying out the test once makes it possible to verify the use or the nonuse of the redundant memory cell row. Thus the usage status of the redundant memory cell row is checked more quickly than before and with higher efficiency.

According to a yet further aspect of the invention, there is provided a semiconductor memory comprising a memory cell array, column selection switching means, a test mode memory cell row, and a test mode row decoder.

The memory cell array has a plurality of memory cells arranged in matrix fashion. The array includes more memory cell columns than all selectable column addresses.

The column selection switching means switches the selection status of the memory cell columns with respect to the column addresses depending on whether any defective memory cell exists in the memory cell array. In this setup, the column selection switching means forms one of first and second status selectively.

The first status is selected in the absence of any defective memory cell column. This status is one in which the memory cell columns are selected to correspond with the column addresses on a one-to-one basis starting from the memory cell column at one end of the memory cell array.

The second status is selected in the presence of a defective memory cell column. This status is one in which, of the memory cell columns selected in the first status, the defective memory cell column and those memory cell columns starting therefrom and located in the direction of the other end of the memory cell array are each replaced by the adjacent memory cell column in the direction of that other end.

The test mode memory cell row is composed of a plurality of test memory cells associated respectively with the memory cell columns of the memory cell array. Each of the test memory cells making up the test mode memory cell row has previously stored information different from the information stored in the adjacent test memory cells.

The test mode row decoder receives a test mode signal representing a test mode, and selects the test mode memory cell row in response to the test mode signal received in the test mode.

In the test mode, the column addresses of the memory cell array are selected by turns in order to retrieve the information stored in the test memory cells associated respectively with the column addresses to check if any memory cell column is replaced by the column selection switching means.

With this structure, the memory cell array has its memory cell columns selected differently depending on the presence or absence of any defective memory cell and on the location thereof.

If there is no defective memory cell column, the column selection switching means forms the first status; if a faulty memory cell column exists, the column selection switching means forms the second status.

With the second status in effect, the following takes place: of the memory cell columns selected in the first status, the defective memory cell column and those memory cell columns starting therefrom and located on the side of the memory cell column not selected in the first status are each replaced by the adjacent memory cell column on the side of the unselected memory cell column.

In the test mode, the receipt of the test mode signal prompts the test mode row decoder to select only the test mode memory cell row in the row direction, and the column addresses by turns in the column direction.

Thus in the test mode, the stored information is retrieved from each test memory cell of the test mode memory cell row. Each of the test memory cells has the previously stored information different from the information stored in the adjacent test memory cells.

The stored information retrieved from the memory cell array with none of its memory cell columns replaced by the redundant memory cell column appears arranged in regular fashion. By contrast, the information retrieved from a memory cell array with any of its memory cell columns replaced by the redundant memory cell column appears arranged in partially irregular fashion.

This means that in the test mode, whether or not any memory cell column has been replaced is verified on the basis of the retrieved information appearing arranged in regular or irregular fashion. At the same time, the column address of the defective memory cell column can also be identified.

With this structure, simply carrying out the test once makes it possible to verify the use or the nonuse of the redundant memory cell column. Thus the usage status of the redundant memory cell column is checked more quickly than before and with higher efficiency.

According to another aspect of the invention, there is provided a semiconductor memory comprising a memory cell array, row selection switching means, a test mode memory cell column, and a test mode multiplexer.

The memory cell array has a plurality of memory cells arranged in matrix fashion. The array includes more memory cell rows than all selectable row addresses.

The row selection switching means switches the selection status of the memory cell rows with respect to the row addresses depending on whether any defective memory cell exists in the memory cell array. The row selection switching means forms one of first and second status selectively.

The first status is selected in the absence of any defective memory cell row. This status is one in which the memory cell rows are selected to correspond with the row addresses on a one-to-one basis starting from the memory cell row at one end of the memory cell array.

The second status is selected in the presence of a defective memory cell row. This status is one in which, of the memory cell rows selected in the first status, the defective memory cell row and those memory cell rows starting therefrom and located in the direction of the other end of the memory cell array are each replaced by the adjacent memory cell row in the direction of that other end.

The test mode memory cell column is composed of a plurality of test memory cells associated respectively with the memory cell rows of the memory cell array. Each of the test memory cells making up the test mode memory cell column has the previously stored information different from the information stored in the adjacent test memory cells.

The test mode multiplexer receives a test mode signal representing a test mode, and selects the test mode memory cell column in response to the test mode signal received in the test mode.

In the test mode, the row addresses of the memory cell array are selected by turns in order to retrieve the information stored in the test memory cells associated respectively with the row addresses to check if any memory cell row is replaced by the row selection switching means.

With this structure, the memory cell array has its memory cell rows selected differently depending on the presence or absence of any defective memory cell and on the location thereof.

If there is no defective memory cell column, the row selection switching means forms the first status; if a faulty memory cell row exists, the row selection switching means forms the second status.

With the second status in effect, the following takes place: of the memory cell rows selected in the first status, the defective memory cell row and those memory cell rows starting therefrom and located on the side of the memory cell row not selected in the first status are each replaced by the adjacent memory cell row on the side of the unselected memory cell row.

In the test mode, the receipt of the test mode signal prompts the test mode multiplexer to select only the test mode memory cell column in the column direction, and the row addresses by turns in the row direction.

Thus in the test mode, the stored information is retrieved from each test memory cell represented by each of the row addresses. Each of the test memory cells has the previously stored information different from the information stored in the adjacent test memory cells.

The stored information retrieved from the memory cell array with none of its memory cell rows replaced by the redundant memory cell row appears arranged in regular fashion. By contrast, the information retrieved from a memory cell array with any of its memory cell rows replaced by the redundant memory cell row appears arranged in partially irregular fashion.

This means that in the test mode, whether or not any memory cell row has been replaced is verified on the basis of the retrieved information appearing arranged in regular or irregular fashion. At the same time, the row address of the defective memory cell row can also be identified.

With this structure, simply carrying out the test once makes it possible to verify the use or the nonuse of the redundant memory cell row. Thus the usage status of the redundant memory cell row is checked more quickly than before and with higher efficiency.

According to a further aspect of the invention, there is provided a semiconductor memory for generating a test mode signal, comprising power supply nodes, latch means and potential supply means.

The power supply nodes receive a supply potential. The latch means latches, in synchronism with the receipt of the supply potential, the output of a first potential having a first logical value.

The potential supply means receives a write control signal representing a write mode and supplies, in the write mode and in response to the write control signal, the latch means with a second potential having a second logical value to be latched.

With this structure in operation, the receipt of the supply potential prompts the latch means to latch the output of the first potential having the first logical value. In the write mode, the potential supply means upon receiving the write control signal supplies the latch means with the second potential having the second logical value.

In response, the latch means latches the second potential in the write mode. The test mode signal is a signal based on the output signal latched by the latch means. Thus the test mode signal may be activated upon receipt of the supply potential and inactivated in the subsequent write mode.

The constitution above makes it possible to generate the test mode signal without recourse to an external test mode signal. As a result, the period from the time the supply potential is received up to the time the initial write mode is started may be established as a test mode period.

Because the test mode signal is generated inside the semiconductor memory, the test on the usage status of redundant bits and other checks may be carried out without the use of an external test mode signal.

According to an even further aspect of the invention, there is provided a semiconductor memory comprising a memory cell array, a redundant memory cell row, a redundant memory cell column, a test mode memory cell row, and a test mode memory cell column.

The memory cell array has a plurality of memory cells arranged in matrix fashion. The redundant memory cell row is furnished where appropriate relative to the memory cell array and is replaceable with any one memory cell row of the memory array.

The redundant memory cell column is furnished where appropriate relative to the memory cell array and is replaceable with any one memory cell column of the memory cell array.

The test mode memory cell row is formed outside the memory cell rows of the memory cell array, the test mode memory cell row being composed of a plurality of test memory cells. The test mode memory cell column is formed outside the memory cell columns of the memory cell array, the test mode memory cell column being composed of a plurality of test memory cells.

The test mode memory cell row is selected in a test mode so as to check if the redundant memory cell column has replaced any memory cell column. The test mode memory cell column is selected in the test mode so as to check if the redundant memory cell row has replaced any memory cell row.

With this structure, the test mode memory cell row and column are each furnished outside the memory cell array.

Generally, there is provided a superfluous wiring pattern between two sides, one being the inside of the memory cell array where the wiring pattern concentration is dense, the other being the outside of the memory cell array where the wiring pattern concentration is sparse. The purpose in furnishing the superfluous wiring pattern is to even out the wiring pattern distribution throughout the memory cell array.

This invention envisages furnishing a test mode memory cell row and a test mode memory cell column. The row and the column play the role of the superfluous wiring pattern mentioned above.

The arrangement above thus evens out the wiring pattern distribution of the memory cell array. Because the test mode memory cell row and column take the place of the superfluous wiring pattern, there is no need to allow for a conventionally required area for accommodating the test mode memory cell row and column in addition to the superfluous wiring pattern. This minimizes any circuit area increase stemming from providing the memory cell row and column for the test mode.

The foregoing and other objects, features, aspects and advantages of the present invention will become apparent from the following detailed description of the present invention when taken in conjunction with the accompanying drawings.

DESCRIPTION OF THE PREFERRED EMBODIMENTS

Preferred embodiments of the invention will now be described with reference to the accompanying drawings.

First Embodiment

Figure 1:
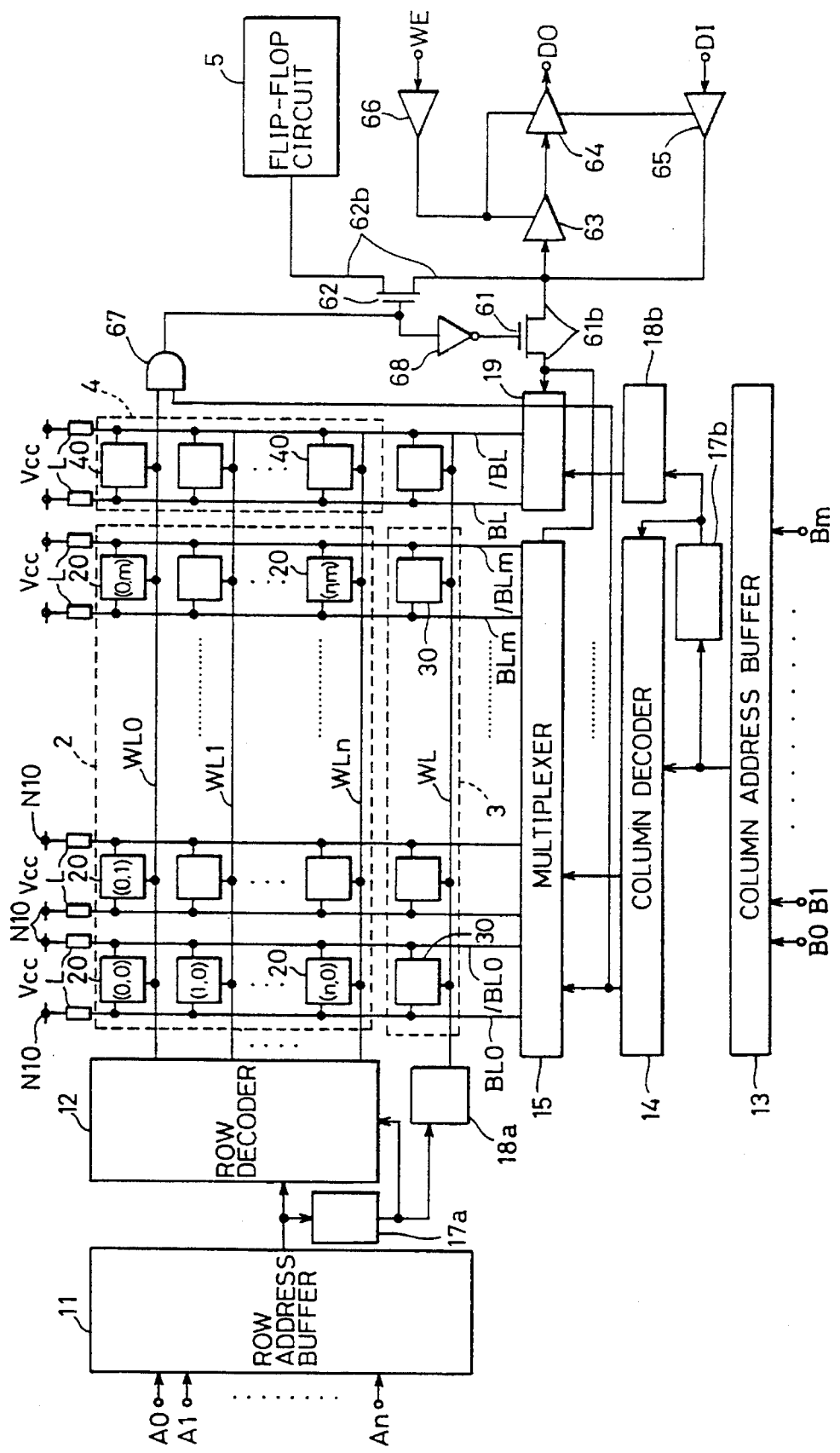
FIG. 1 is a block diagram of a semiconductor memory having redundant memory cells and practiced as a first embodiment of the invention.

FIG. 1 is a block diagram of a semiconductor memory having redundant memory cells and practiced as the first embodiment of the invention.

Referring to FIG. 1, the semiconductor memory comprises a memory array 2, a redundant memory cell row 3, a redundant memory cell column 4, a row address buffer 11, a row decoder 12, a column address buffer 13, a column decoder 14, a multiplexer 15, redundancy program circuits 17a and 17b, a redundant row decoder 18a, a redundant column decoder 18b, a redundancy multiplexer 19, a flip-flop circuit 5, NMOS transistors 61 and 62, data buses 61b and 62b, a sense amplifier 63, an output data buffer 64, an input data buffer 65, a control circuit 66, a specific address detecting gate 67, and an inverter 68.

The memory cell array 2 includes a plurality of memory cells 20, 20, . . . , a plurality of word lines WL0-WLn, and a plurality of bit line pairs BL0,/BL0-BLm, /BLm. The word lines WL0-WLn intersect the bit line pairs BL0,/BL0-BLm, /BLm respectively.

Each of the bit line pairs BL0,/BL0-BLm,/BLm is connected to power supply nodes N10 that receive a supply potential VCC via bit line loads L. The multiple memory cells 20, 20, . . . are provided at the points of intersection between the word lines and the bit line pairs. Each of the memory cells 20, 20, . . . is connected to the corresponding word line and bit line pair.

The redundant memory cell row 3 is composed of a plurality of redundant memory cells 30, 30, etc. A word line WL is furnished in conjunction with the redundant memory cell row 3. Each of the redundant memory cells 30, 30, . . . is connected to the word line WL and to the corresponding bit line pairs from among BL0,/BL0-BLm, /BLm.

The redundant memory cell column 4 is composed of a plurality of redundant memory cells 40, 40, etc. A bit line pair BL,/BL is furnished in conjunction with the redundant memory cell column 4. Each of the redundant memory cells 40, 40, . . . is connected to the bit-line pair BL,/BL and to the corresponding word lines from among WL0-BLn.

The row address buffer 11 receives a row address signal A0-An, amplifies the received signal, rectifies the amplified signal in waveform, and outputs the waveform-rectified signal. The row decoder 12 receives the output signal of the row address buffer 11, decodes the received signal, and activates accordingly a memory cell row in the memory cell array 2. This selects the applicable memory cell row in the memory cell array 2.

The column address buffer 13 receives a column address signal B0-Bm, amplifies the received signal, rectifies the amplified signal in waveform, and outputs the waveform-rectified signal. The column decoder 14 receives the output signal of the column address buffer 13 and decodes the received signal. The decoded output signal of the column decoder 14 is sent to the multiplexer 15.

On the basis of the output signal of the column decoder 15, the multiplexer 15 activates a memory cell column in the memory cell array 2. This selects the appropriate memory cell column. For a read operation, the multiplexer 15 supplies the data bus 16b with the read data retrieved from the selected memory cell column. For a write operation, the multiplexer 15 feeds the selected memory cell column with the write data sent over the data bus 61b.

The redundancy program circuit 17a has a programmed row address of the row replaced by the redundant memory cell row 3. The redundancy program circuit 17a receives the row address signal from the row address buffer 11 and checks to see if the row address of the received signal coincides with the programmed row address. If the two addresses coincide with each other, the redundancy program circuit 17a generates a signal for inactivating the row decoder 12 and a signal for activating the redundant row decoder 18a.

The row decoder 12 is inactivated upon receipt of the signal from the redundancy program circuit 17a. The redundant row decoder 18a is activated on receiving the signal from the redundancy program circuit 17a. The receipt of the signal from the redundancy program circuit 17a activates the redundant row decoder 18a and has the word line WL selected. This selects the redundant memory cell row 3.

The redundancy program circuit 17b has a programmed column address of the column replaced by the redundant memory cell column 4. The redundancy program circuit 17b receives the column address signal from the column address buffer 13 and checks to see if the column address of the received signal coincides with the programmed column address. If the two signals coincide with each other, the redundancy program circuit 17b generates a signal for inactivating the column decoder 14 and a signal for activating the redundant column decoder 18b.

The column decoder 14 is inactivated upon receipt of the signal from the redundancy program circuit 17b. The redundant column decoder 18b is activated when receiving the signal from the redundancy program circuit 17b. When activated, the redundant column decoder 18b supplies the redundancy multiplexer 19 with a signal for selecting the redundant memory cell column 4.

In response to the output signal of the redundant column decoder 18b, the redundancy multiplexer 19 selects the bit line pair BL,/BL. For a read operation, the redundancy multiplexer 19 supplies the data bus 61b with the read data retrieved from the redundant memory cell column 4. For a write operation, the redundancy multiplexer 19 feeds the redundant memory cell column 4 with the write data sent over the data bus 61b.

A switching transistor 61 is furnished to the data bus 61b. When the transistor 61 is turned on, the data bus 61b is allowed to transmit data.

The read data sent from the multiplexer 15 or redundancy multiplexer 19 onto the data bus 61b passes through the transistor 61, sense amplifier 63 and output data buffer 64, to be output as a data output signal DO. A data input signal DI is fed to the data bus 61b via the input data buffer 65. The data input signal DI is also sent to the multiplexer 15 or redundancy multiplexer 19 via the transistor 61.

A read/write control signal WE is given to the control circuit 66. For a read operation, the control circuit 66 responds to the read/write control signal WE by activating the sense amplifier 63 and output data buffer 64 and by inactivating the input data buffer 65. This allows the data output signal DO to be output.

For a write operation, the control circuit 66 responds to the read/write control signal WE by activating the input data buffer 65 and by inactivating the sense amplifier 63 and output data buffer 64. This allows the data input signal DI to be input.

The flip-flop circuit 5 brings its output signal High upon receipt of the supply potential provided that at least one of the redundant memory cell row 3 and redundant memory cell column 4 is used.

The output signal of the flip-flop circuit 5 is sent over the data bus 62b and fed to the node between the transistor 61 and the sense amplifier 63. The data bus 62b is provided with a transistor 62 that operates as a switching circuit. When the transistor 62 is turned on, the data bus 62b allows the signal to be transmitted.

The specific address detecting gate 67 is constituted by an AND gate. The specific address detecting gate 67 receives two signals: the signal corresponding to a specific row address "0" that is output by the row decoder 12 and transmitted over the word line WL0, and the signal corresponding to a specific column address "0" that is output by the column decoder 14 for selecting the bit line pair BL0,/BL0. When these two received signals are both active, the specific address detecting gate 67 brings its output signal High.

The output signal of the specific address detecting gate 67 is fed to the gate of the transistor 62 and is sent via the inverter 68 to the gate of the transistor 61. If the output signal of the specific address detecting gate 67 is Low, the transistor 61 is turned on and the transistor 62 off. In this case, input/output data is transmitted over the data bus 61b, and no data is transmitted over the data bus 62b.

If the output signal of the specific address detecting gate 67 is High, the transistor 62 is turned on and the transistor 61 off. In this case, data is transmitted over the data bus 62b, and no data is transmitted over the data bus 61b.

The operations characteristic of the first embodiment in FIG. 1 will now be described. When the specific address (row, column)=(0, 0) is selected for a read or a write operation, the memory cell 20 corresponding to that address is not selected. Instead, the specific address detecting gate 67 selects the flip-flop circuit 5. In this case, data is written or read to or from the flip-flop circuit 5.

Suppose that the supply potential VCC is received when at least one of the redundant memory cell row 3 and redundant memory cell column 4 is selected. In that case, the flip-flop circuit 5 brings its output signal Low. If neither the redundant memory cell row 3 nor the redundant memory cell column 4 is utilized, the output signal of the flip-flop circuit 5 is High.

With this semiconductor memory, it is necessary to select the specific address (0, 0) after power-up if it is desired to detect the use or the nonuse of the redundant memory cell row 3 and redundant memory cell column 4.

With the specific address selected, the output signal of the specific address detecting gate 67 turns on the transistor 62 and turns off the transistor 61. This allows the output signal of the flip-flop circuit 5 to be read to the outside via the data bus 62b, sense amplifier 63 and output data buffer 64.

As described and with the supply potential received, the output signal of the flip-flop circuit 5 goes High if at least one of the redundant memory cell row 3 and redundant memory cell column 4 is used, and goes Low if none of the row 3 and column 4 is employed.

Thus the use or the nonuse of the redundant memory cell row 3 and redundant memory cell column 4 is verified as follows: after power-up, the specific address (0, 0) is selected for a read operation, and then the level of the signal that is read out accordingly is checked for redundant memory cell usage.

Figure 2:
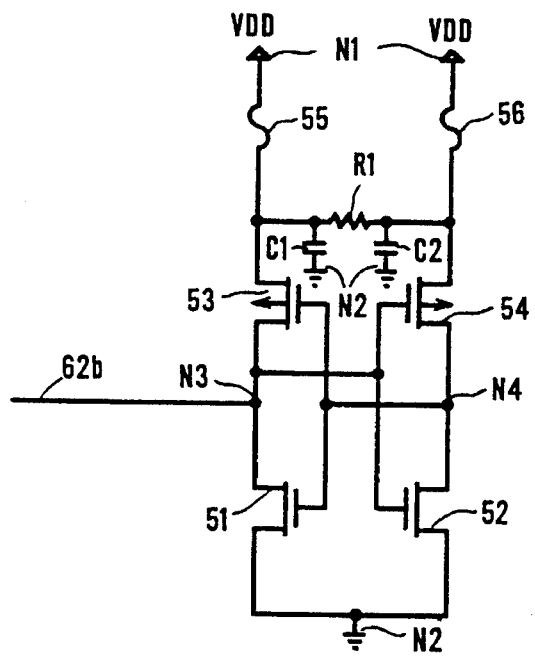
FIG. 2 is a circuit diagram of a flip-flop circuit included in FIG. 1.

What follows is a more detailed description of the flip-flop circuit 5 shown in FIG. 1. FIG. 2 is a circuit diagram outlining the constitution of the flip-flop circuit in FIG. 1. Referring to FIG. 2, the flip-flop circuit 5 comprises NMOS transistors 51 and 52, PMOS transistors 53 and 54, fuses 55 and 56, a resistor R1, and capacitors C1 and C2.

The fuse 55 and the transistors 53 and 51 are connected in a serial and interposing manner between power supply nodes N1 receiving the supply potential on the one hand, and a grounding node N2 receiving a grounding potential on the other. The fuse 56 and the transistors 54 and 52 are also connected in serial and interposing fashion between the power supply nodes N1 and the grounding node N2.

The node N3 between the transistors 53 and 51 is connected to the gates of the transistors 54 and 52. The node N4 between the transistors 54 and 52 is connected to the gates of the transistors 53 and 51. The resistor R1 is connected interposingly between two nodes: one node is located between the fuse 55 and the transistor 53; the other node is furnished between the fuse 56 and the transistor 54.

The capacitor C1 is connected interposingly between one end of the resistor R1 and the grounding node N2. The capacitor C2 is connected interposingly between the other end of the resistor R1 and the grounding node N2. The node N3 is connected to the data bus 62b.

In this flip-flop circuit 5, the fuse 55 is made to blow beforehand if at least one of the redundant memory cell row 3 and redundant memory cell column 4 is used; the fuse 56 is made to blow in advance if none of the row 3 and column 4 is in use.

How the flip-flop circuit of FIG. 2 works will now be described. Where the fuse 55 has previously blown, the receipt of the supply potential VDD turns on the transistor 54 ahead of the transistor 53. This is because the resistor R1 and the capacitors C1 and C2 slow down the increase in potential difference between the gate and source of the transistor 53 apart from the increase in potential difference between the gate and source of the transistor 54.

In the case above, the potential of the node N4 is High. The potential of the node N4 being High turns the transistor 51 on. This in turn brings the potential of the node N3 Low. As a result, the output signal of the flip-flop circuit 5 transmitted to the data bus 62b is Low.

Where the fuse 56 has previously blown, the receipt of the supply potential turns on the transistor 53 ahead of the transistor 54. Correspondingly, the potential of the node N3 is now High and the transistor 52 is turned on accordingly, as opposed to the case where the fuse 55 has previously blown.

In that case, the potential of the node N4 is brought Low. This drives High the output signal of the flip-flop circuit 5 transmitted to the data bus 62b.

As described, when at least one of the redundant memory cell row 3 and redundant memory cell column 4 is used, the output signal of the flip-flop circuit 5 goes Low in response to the receipt of the supply potential. On the other hand, if neither the redundant memory cell row 3 nor the redundant memory cell column 4 is in use, the output signal of the flip-flop circuit 5 goes High in response to the receipt of the supply potential.

Second Embodiment

The second embodiment of the invention will now be described. In describing the second embodiment, mention will be made of a variation of the flip-flop circuit in FIG. 2. More specifically, this variation of flip-flop circuit involves having a fuse blow only if at least one of the redundant memory cell row 3 and redundant memory cell column 4 is used.

Figure 3:
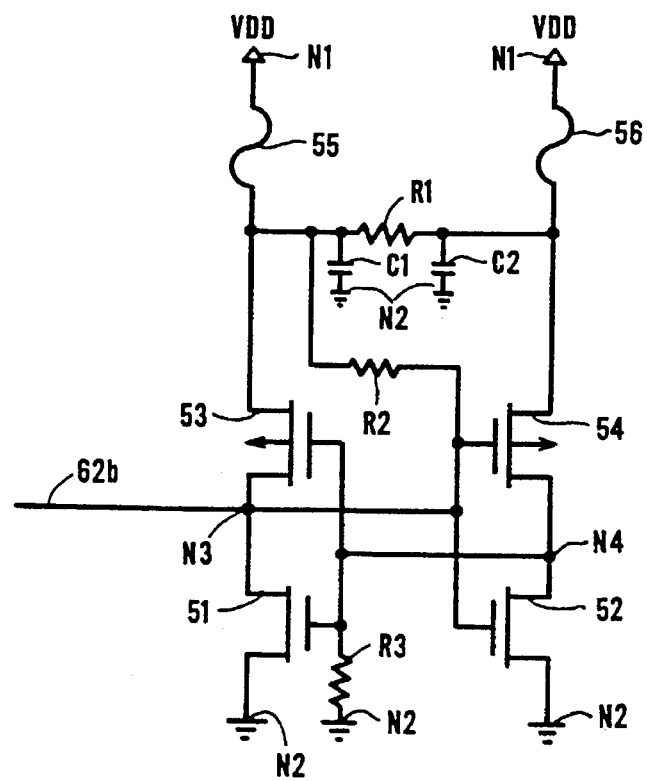
FIG. 3 is a circuit diagram of a flip-flop circuit constituting part of a second embodiment of the invention.

FIG. 3 is a circuit diagram of the modified flip-flop circuit constituting part of the second embodiment of the invention. Of the component parts in FIG. 3, those also shown in FIG. 2 are designated by like reference numerals and their descriptions are omitted where redundant.

What makes the flip-flop circuit of FIG. 3 different from that of FIG. 2 is that the circuit of FIG. 3 includes additional resistors R2 and R3 having high resistance values. The resistor R2 is furnished interposingly between two nodes: one node is located between the fuse 55 and the transistor 53; the other node connects the gate of the transistor 54, the gate of the transistor 52 and the node N3. The resistor R3 is also provided interposingly between two nodes: one node connects the gate of the transistor 53, the gate of the transistor 51 and the node N4; the other node is the grounding node N2.

In this flip-flop circuit of FIG. 3, the fuse 55 is made to blow only when one of the redundant memory cell row 3 and redundant memory cell column 4 is used. The fuse 56 remains intact.

The flip-flop circuit of FIG. 3 works as follows: if the supply potential VDD is received while the fuses 55 and 56 both remain intact, the potential received by the transistor 52 at its gate goes High ahead of the potential received by the transistor 51 at its gate.

This drives High the potential of the node N3. In this case, the output signal of the flip-flop circuit 5 transmitted to the data bus 62b goes High.

If the supply potential is received where the fuse 55 has blown, the resistor R1 and the capacitors C1 and C2 work to slow down the increase in the potential received by the gate of the transistor 54. This causes the transistor 54 to be turned on ahead of the transistor 53.

In that case, the potential of the node N4 is brought High. The potential of the node N4 going High turns on the transistor 51. This in turn drives Low the potential of the node N3. In this case, the output signal of the flip-flop circuit 5 sent to the data bus 62b is brought Low.

In the manner described, the flip-flop circuit of FIG. 3 has no need for the fuses 55 and 56 to blow when neither the redundant memory cell row 3 nor the redundant memory cell column 4 is used. This shortens the time required to make preparations for verifying the use or the nonuse of the redundant memory cell row 3 and redundant memory cell column 4.

Where the semiconductor memory is arranged to operate without recourse to the redundant memory cell row or column, there is no need for fuse melting equipment such as the laser trimming device to be installed.

Third Embodiment

The third embodiment of the invention will now be described. In describing the third embodiment, mention will be made of a setup for increasing the speed at which a specific address is detected by the specific address detecting gate 67 of FIG. 1.

Figure 4:
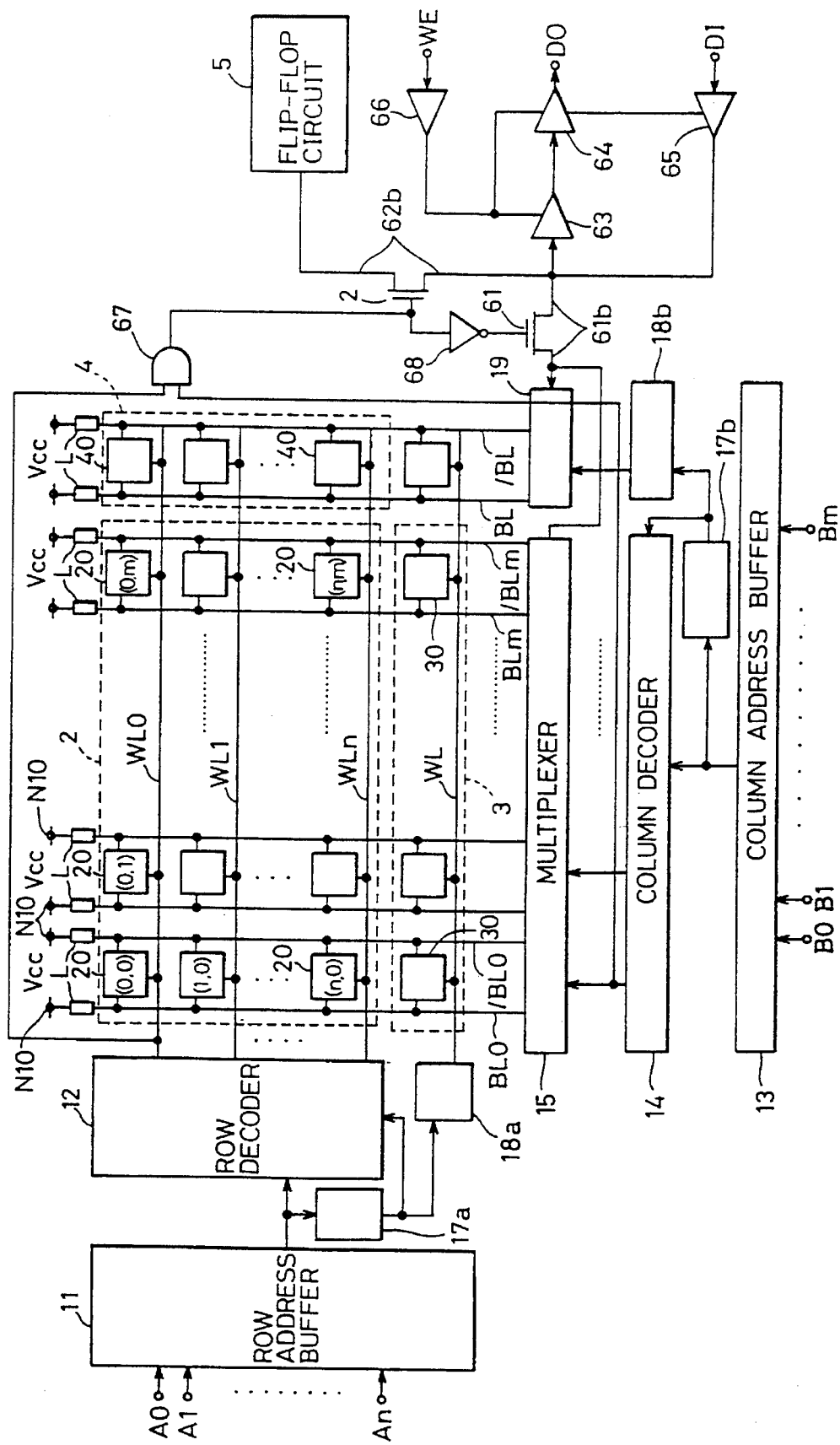
FIG. 4 is a block diagram of a semiconductor memory having redundant memory cells and practiced as a third embodiment of the invention.

FIG. 4 is a block diagram of a semiconductor memory having redundant memory cells and practiced as the third embodiment of the invention. Of the component parts of the semiconductor memory in FIG. 4, those also shown in FIG. 1 are designated by like reference numerals and their descriptions are omitted where redundant.

What makes the semiconductor memory of FIG. 4 different from that of FIG. 1 lies in the route for transmitting the output signal of the row decoder 12 to be received by the specific address detecting gate 67. That is, in FIG. 4, the specific address detecting gate 67 receives the output signal of the row decoder 12 directly over a route separate from the word line WL0.

This setup allows the specific address detecting gate 67 of FIG. 4 to receive the output signal of the row decoder 12 more quickly than if the signal is received from the terminal of the word line WL0. That is, the speed at which to detect the specific address using the specific address detecting gate 67 is boosted. As a result, it is possible to verify the use or the nonuse of the redundant memory cell row 3 and redundant memory cell column 4 at higher speed than before.

Fourth Embodiment

The fourth embodiment of the invention will now be described. The fourth embodiment comprises a plurality of units of the type of flip-flop circuit employed in the first through the third embodiment, the circuit outputting signals of different levels depending on the use or the nonuse of redundant bits.

Figure 5:
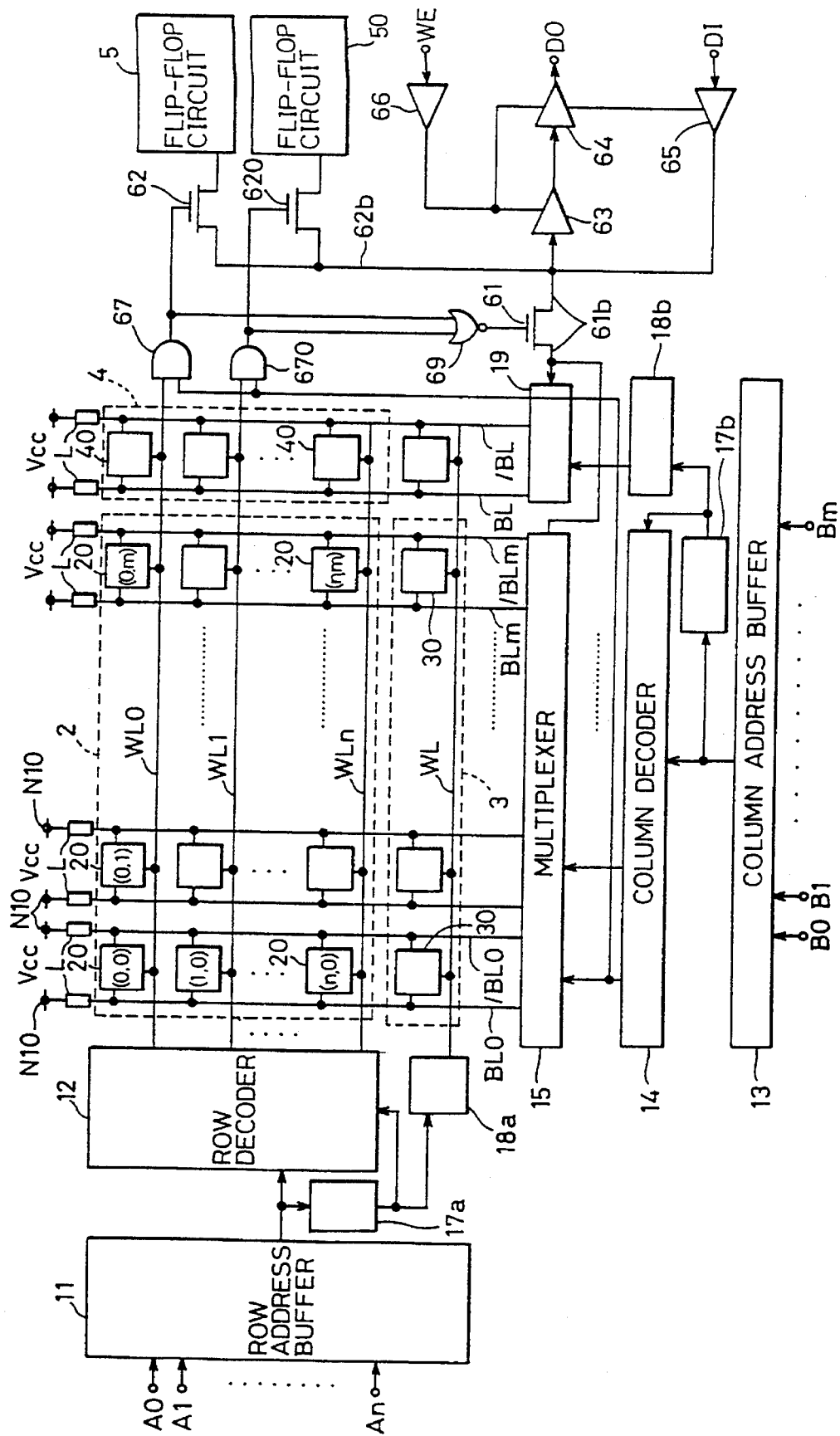
FIG. 5 is a block diagram of a semiconductor memory having redundant memory cells and practiced as a fourth embodiment of the invention.

FIG. 5 is a block diagram of a semiconductor memory having redundant memory cells and practiced as the fourth embodiment of the invention. Of the component parts of the semiconductor memory in FIG. 5, those also shown in FIG. 1 are designated by like reference numerals and their descriptions are omitted where redundant.

The fourth embodiment of. FIG. 5 differs from the semiconductor memory of FIG. 1 in that the fourth embodiment additionally includes a flip-flop circuit 50, a specific address detecting gate 670, and an NMOS transistor 620. Further in the fourth embodiment, a NOR gate 69 takes the place of the inverter 68 in FIG. 1.

The flip-flop circuit 50 is structurally identical to the flip-flop circuit 5. The specific address detecting gate 670 receives two signals: one representing a specific row address "1" output by the row decoder 12 and transmitted over the word line WL1, the other representing the column address "0" output by the column decoder 14 for selecting the bit line pair BL0,/BL0. If the received signals are both active, the specific address detecting gate 670 drives its output signal High.

The transistor 620 is furnished on the data bus 62b. The gate of the transistor 620 receives the output signal of the specific address detecting gate 670. The transistor 620 switches on or off in response to the output signal of the specific address detecting gate 670. When the transistor 620 switches on, data is allowed to be sent to the flip-flop circuit 50.

The NOR gate 69 receives the output signals of the two specific address detecting gates 67 and 670. If at least one of the two received signals is High, the NOR gate 69 sends a low-level output signal to the gate of the transistor 61; otherwise the NOR gate 69 supplies a high-level output level to the gate of the transistor 61.

Where the redundant memory cell row 3 is used, the flip-flop circuit 5 is arranged to generate a low-level output signal in response to the receipt of the supply potential. Where the redundant memory cell column 4 is utilized, the flip-flop circuit 50 is arranged to generate a low-level output signal in response to the receipt of the supply potential. The output status of the flip-flop circuits 5 and 50 is established in accordance with whether the fuse means of each circuit is made to blow under specific circumstances.

The operations characteristic of the semiconductor memory in FIG. 5 will now be described. When the specific address (0, 0) or (1, 0) is selected, the transistor 61 is turned off. When the specific address (0, 0) is selected, the transistor 62 is turned on. When the specific address (1, 0) is selected, the transistor 620 is turned on.

Thus if the specific address (0, 0) is selected for a read operation, the output signal of the flip-flop circuit 5 is sent to the outside as the data output signal DO. If the specific address (1, 0) is selected, the output signal of the flip-flop circuit 50 is output as the data output signal DO.

Whether or not the redundant memory cell row 3 is used is verified by selecting the specific address (0, 0) after power-up for a read operation. Whether or not the redundant memory cell column 4 is employed is ascertained by selecting te specific address (1, 0) after power-up for a read operation.

Checks are made on the levels of the data output signals DO retrieved in the above cases. The checks reveal whether or not the redundant memory cell row 3 and the redundant memory cell column 4 are in use.

The fourth embodiment comprises a pair of flip-flop circuits, a pair of transistors and a pair of specific address detecting gates. Alternatively, three or more units of each of these component parts may be furnished.

Where a large number of flip-flop circuits are provided as described, the signals from these circuits may be coded. The information thus coded may be arranged to serve as the basis for determining the row and the column replaced by the redundant memory cell row 3 and redundant memory cell column 4 respectively. Thus verifying the coded information makes it possible to identify the row and the column replaced by the redundant memory cell row 3 and column 4 respectively.

In the first through the fourth embodiment described above, the flip-flop circuit 5 (as well as the flip-flop circuit 50) is furnished outside the memory cell array 2. This setup offers high driving capability. The reason for this is as follows:

Since numerous memory cells are generally provided, the area occupied thereby needs to be a minimum. This requires each memory cell to have a shortened transistor gate width. As a result, the driving capability of each memory cell is small.

By contrast, there is no need to furnish a large number of flip-flop circuits 5. Even if the size of each flip-flop circuit 5 is several to tens of times as large as the unit memory cell size, the total area of the flip-flop circuits is negligible compared with the chip area.

This makes it possible to enlarge the channel width of the transistors constituting the flip-flop circuit. The arrangement in turn leads to boosting the driving capability. With the driving capability thus boosted, the flip-flop circuit 5 can operate at high speed.

Fifth Embodiment

The fifth embodiment of the invention will now be described. In describing the fifth embodiment, mention will be made of a setup in which the memory cell array includes a memory cell having the same function as that of the flip-flop circuit 5 of FIG. 1.

Figure 6:
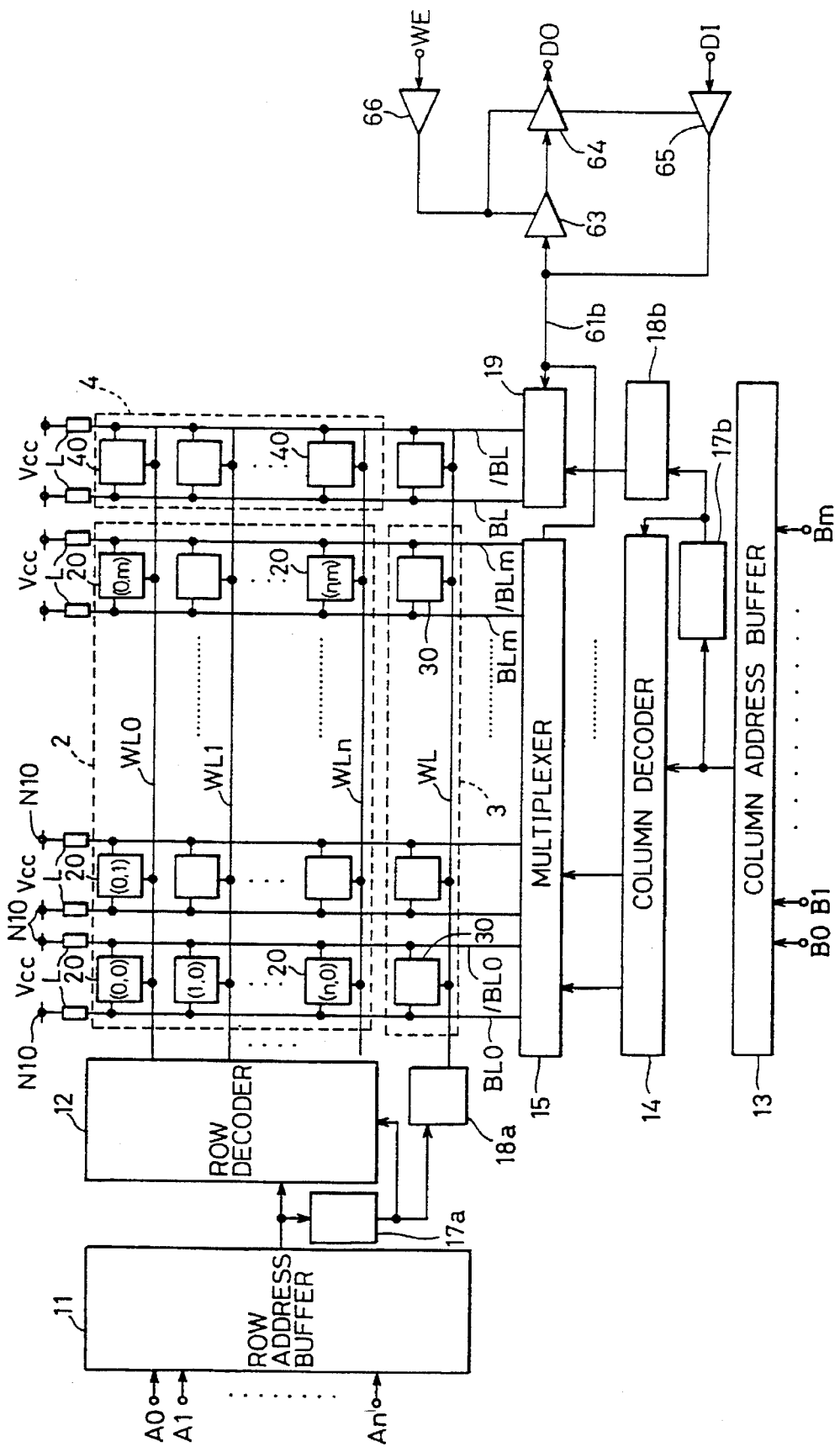
FIG. 6 is a block diagram of a semiconductor memory having redundant memory cells and practiced as a fifth embodiment of the invention.

FIG. 6 is a block diagram of a semiconductor memory having redundant memory cells and practiced as the fifth embodiment of the invention. Of the component parts of the semiconductor memory in FIG. 6, those also shown in FIG. 1 are designated by like reference numerals and their descriptions are omitted where redundant.

What makes the fifth embodiment of FIG. 6 different from the semiconductor memory of FIG. 1 is that the fifth embodiment does not have the flip-flop circuit 5, the transistors 61 and 62, the specific address detecting gate 67 and the inverter 68. But the fifth embodiment does include a memory cell 21 that takes the place of the memory cell 20 corresponding to the specific address (0, 0).

As with the flip-flop circuit 5 of FIG. 1, the memory cell 21 outputs a signal reflecting the stored data and representing the use or the nonuse of redundant bits. The memory cell 21 differs from the flip-flop circuit 5 in that the cell 21 is furnished within the memory cell array 2.

The operations characteristic of the fifth embodiment of FIG. 6 will now be described. For normal read and write operations, the memory cell 21 acts in the same manner as the other memory cells 20.

Upon power-up, the memory cell 21 outputs the signal having a level representing the use or the nonuse of the redundant memory cell row 3 and redundant memory cell column 4. At this point, the workings of the memory cell 21 are the same as those of the flip-flop circuit 5 in FIG. 1.

When the specific address (0, 0) is selected immediately after power-up for a read operation, the memory cell 21 is accessed and data is read therefrom. The read-out data, corresponding to the use or the nonuse of the redundant memory cell row 3 and redundant memory cell column 4, is sent to the outside as the data output signal DO. This permits verification of the use or the nonuse of the redundant memory cell row 3 and redundant memory cell column 4.

Figure 7:
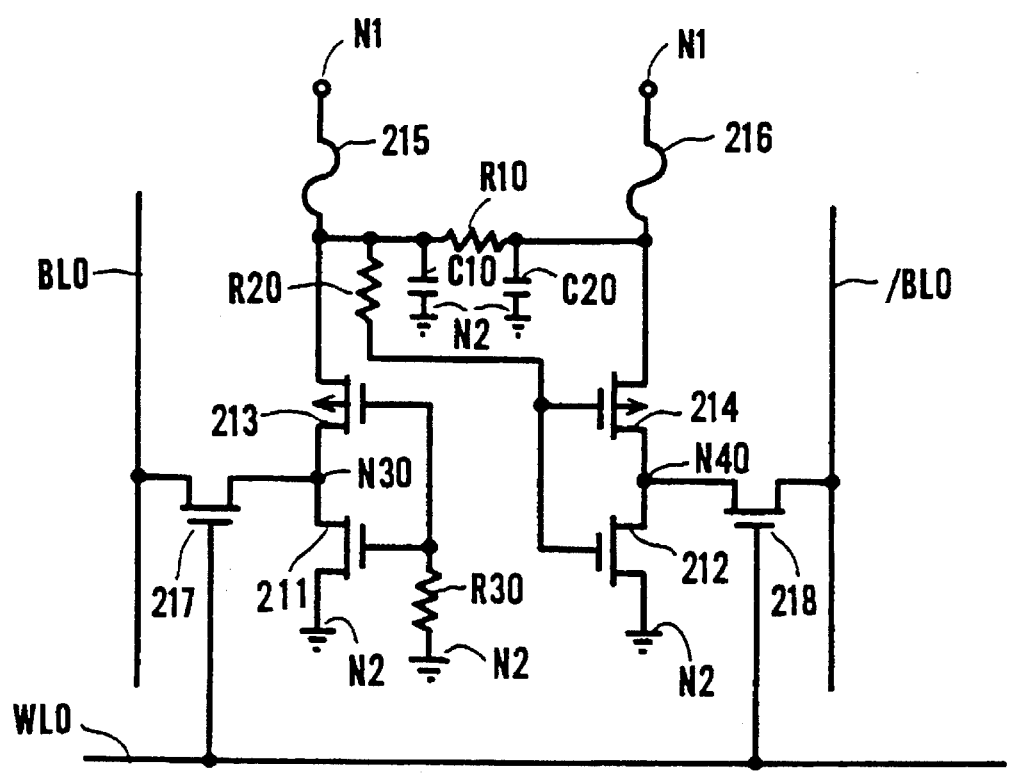
FIG. 7 is a circuit diagram of the memory cell corresponding to a specific address shown in FIG. 6.

What follows is a detailed description of the memory cell 21 in FIG. 6. FIG. 7 is a circuit diagram of the memory cell 21 corresponding to the specific address (0, 0) shown in FIG. 6.

Referring to FIG. 7, the memory cell 21 comprises NMOS transistors 211 and 212; PMOS transistors 213 and 214; fuses 215 and 216; resistors R10, R20 and R30; capacitors C10 and C20; and N-channel type access transistors 217 and 218. Of these component parts, those except for the access transistors 217 and 218 are connected in the same manner as the flip-flop circuit of FIG. 3.

The access transistor 217 has its gate connected to the word line WL0. The transistor 217 is connected interposingly between the bit line BL0 on the one hand, and a node N30 located between the transistors 213 and 211 on the other. The access transistor 218 has its gate connected to the word line WL0. The transistor 218 is connected interposingly between the bit line WL0 on the one hand, and a node N40 located between the transistors 214 and 212 on the other.

Constituted as described, the memory cell 21 acts in the same manner as the other memory cells 20 for normal read and write operations. Immediately after power-up, the memory cell 21 permits output of the signal indicating the use or the nonuse of redundant bits.

With the semiconductor memory practiced as the fifth embodiment, the memory cell 21 in the memory cell array 2 is arranged to output the signal representing the use or the nonuse of the redundant memory cell row 3 and redundant memory cell column 4. This arrangement eliminates the need for furnishing outside the memory array 2 a separate circuit for ascertaining the use or the nonuse of the redundant memory cell row 3 and column 4.

The fifth embodiment includes a single memory cell 21 of the described function. Alternatively, as with the flip-flop circuits in the fourth embodiment, a plurality of memory cells 21 may be provided in conjunction with other addresses.

Sixth Embodiment

The sixth embodiment of the invention will now be described. In describing the sixth embodiment, mention will be made of a setup in which a DRAM (dynamic random access memory) is arranged to have a circuit for verifying the use or the nonuse of the redundant memory cell row 3 and redundant memory cell column 4 shown in FIG. 1.

Figure 8:
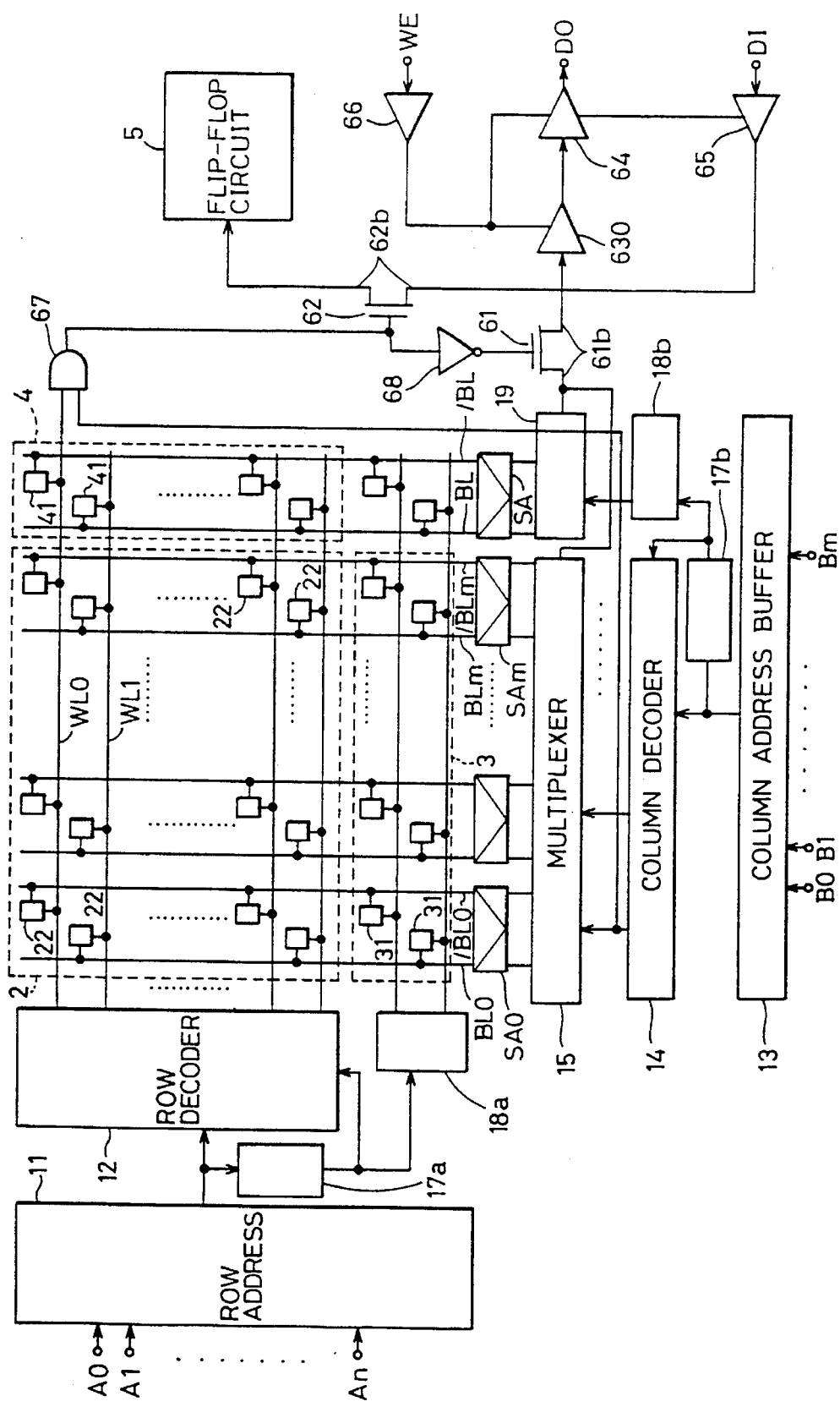
FIG. 8 is a block diagram of a semiconductor memory having redundant memory cells and practiced as a sixth embodiment of the invention.

FIG. 8 is a block diagram of a semiconductor memory having redundant memory cells and practiced as the sixth embodiment of the invention. This semiconductor memory constitutes a DRAM.

The DRAM of FIG. 8 differs from the semiconductor memory that is an SRAM shown in FIG. 1 in the following aspects: sense amplifiers SA0-SAM and SA are provided respectively in conjunction with bit line pairs BL0, BL0-BLm,/BLm and BL,/BL. The sense amplifier 63 in FIG. 1 is replaced by a preamplifier 630. The memory cells 22, 31 and 41 located respectively in the memory cell array 2, in the redundant memory cell row 3 and in the redundant memory cell column 4 each include a capacitor for storing data and an N-channel transistor that functions as a transfer gate.

Constituted as outlined and as with the fifth embodiment, the sixth embodiment (DRAM, a semiconductor memory) allows the use or the nonuse of the redundant memory cell row 3 and redundant memory cell column 4 to be verified on the basis of the output signal of the flip-flop circuit 5.

For the first through the sixth embodiment, it is assumed that the semiconductor memory has both the redundant memory cell row and the redundant memory cell column. Alternatively, this invention also applies to semiconductor memories comprising only one of the redundant memory cell row and column.

Seventh Embodiment

Figure 9:
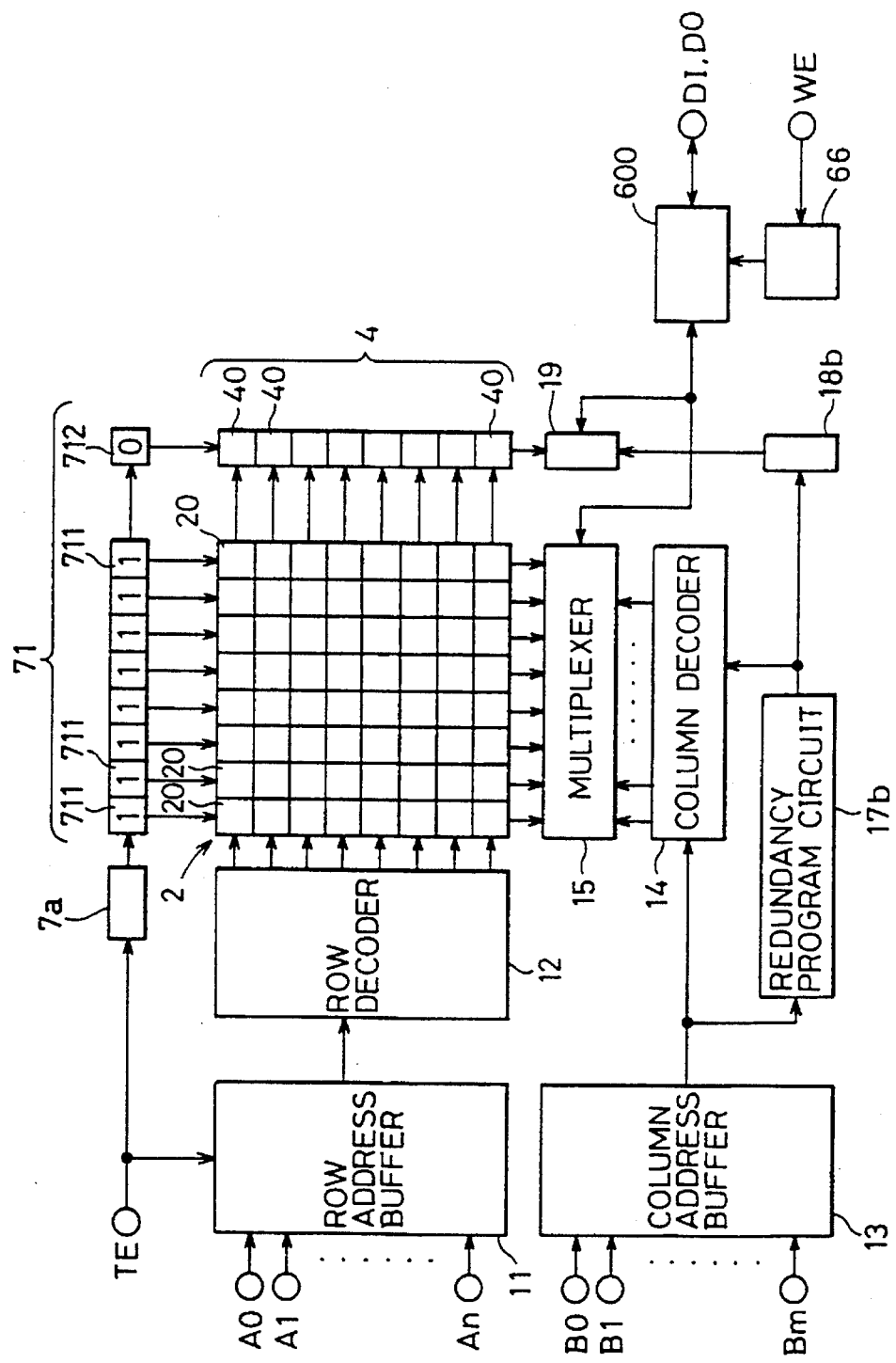
FIG. 9 is a block diagram of a semiconductor memory having redundant memory cells and practiced as a seventh embodiment of the invention.
Figure 31:
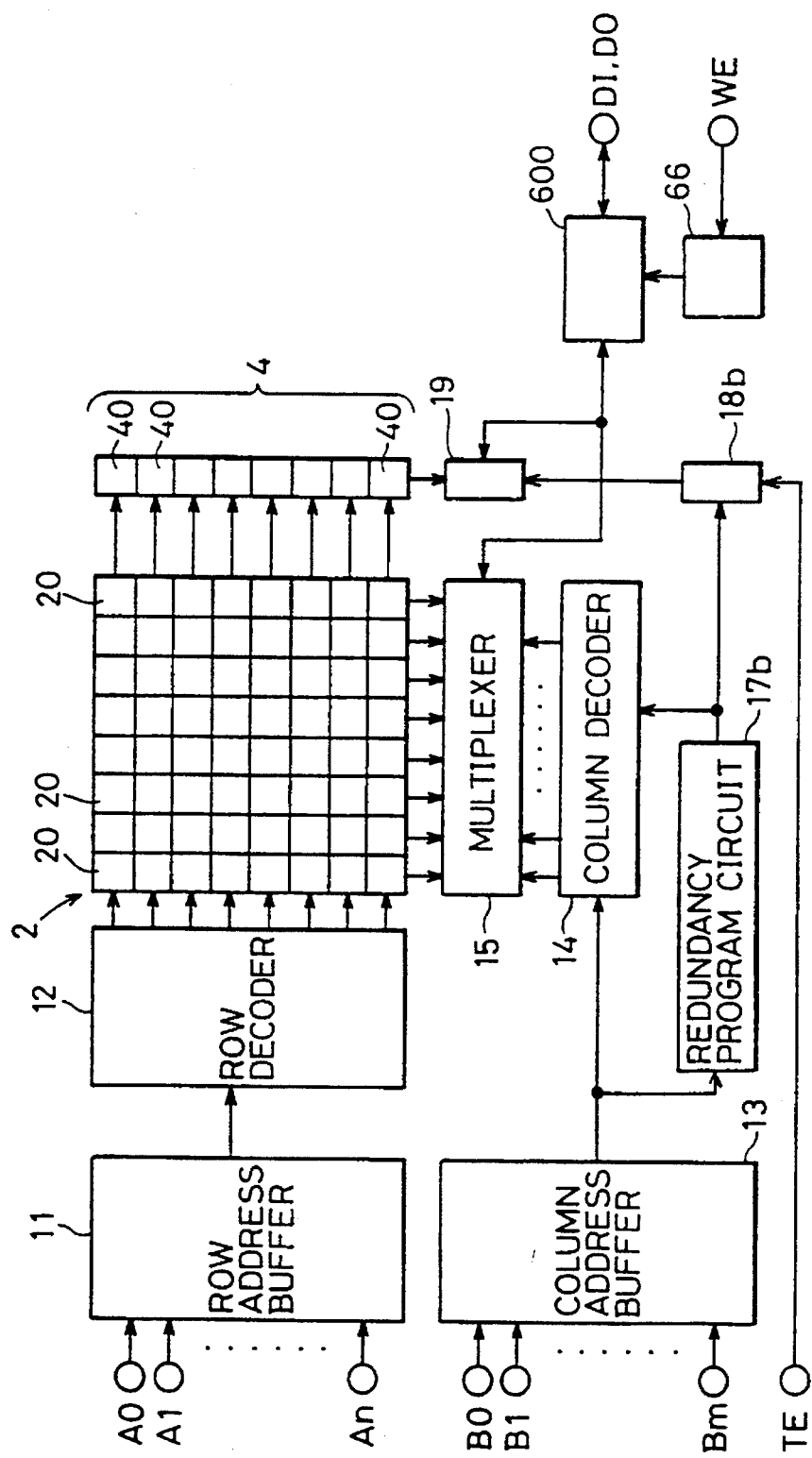
FIG. 31 is a block diagram of another conventional semiconductor memory capable of being verified for the use or the nonuse of redundant bits therein.

FIG. 9 is a block diagram of a semiconductor memory having redundant memory cells and practiced as the seventh embodiment of the invention. Of the component parts of the semiconductor memory in FIG. 9, those also shown in FIG. 31 are designated by like reference numerals and their descriptions are omitted where redundant.

The seventh embodiment of FIG. 9 differs from the semiconductor memory of FIG. 31 in the following aspects: the seventh embodiment comprises a test mode row decoder 7a and a test mode memory cell row 71. Furthermore, the test mode signal TE is sent not to the redundant column decoder 18b but to the test mode row decoder 7a and to the row address buffer 11.

The test mode memory cell row 71 comprises two kinds of test memory cells: test memory cells 711, 711, . . . having previously stored first information "1," and a test memory cell 712 having previously stored second information "0." The test memory cells 711, 711, . . . and 712 have their stored information fixed therein.

The test memory cells 711, 711, . . . are furnished to correspond respectively with the memory cell columns of the memory cell array 2 on a one-to-one basis. The test memory cell 712 is provided to correspond with the redundant memory cell column 4.

If the test mode signal TE is inactive, the row address buffer 11 is activated and the test mode row decoder 7a inactivated. Conversely, if the test mode signal TE is active, the test mode row decoder 7a is activated and the row address buffer 11 inactivated.

How the seventh embodiment of FIG. 9 works will now be described.

(1) In normal mode

In the normal mode, the test mode signal TE is made inactive. Because the inactive test mode signal TE inactivates the test mode row decoder 7a, the test mode memory cell row 71 is disabled, while the row address buffer 11 is activated. Thus in the normal mode, the seventh embodiment functions in the same manner as the conventional semiconductor memory of FIG. 31 for read and write operations.

(2) In test mode

In the test mode, read operations are carried out. This requires activating the test mode signal TE; the row address buffer 11 is inactivated accordingly. Thus no memory cell row in the memory cell array 2 is selected.

In the test mode, the test mode row decoder 7a is activated. This causes the test mode memory cell row 71 alone to be selected in the row direction, and the column addresses by turns in the column direction. Thus in the test mode, data is read from the test mode memory cell row 71 in conjunction with each of the column addresses selected.

Where the redundant memory cell column 4 is not used, the stored information is read from each of the test memory cells 711, 711, . . . in the test mode. That is, the first stored information "1" alone is retrieved if the redundant memory cell column 4 is not in use.

Where the redundant memory cell column 4 is utilized, it means that a defective memory cell column has been replaced thereby. For the column address of the replaced defective memory cell column, the second stored information "0" is retrieved from the test memory cell 712.

That is, with the redundant memory cell column 4 in use, only the information retrieved with respect to the column address of the replaced column turns out to be Thus on the basis of the stored information retrieved in the test mode, it is possible to verify the use or the nonuse of the redundant memory cell column 4 and to identify the memory cell column replaced by the redundant column 4.

With the seventh embodiment, the first information "1" is stored in the test memory cells 711, 711, . . . and the second information "0" in the test memory cell 712. However, this is not limitative of the invention. Alternatively, the second information "0" may be stored in each of the test memory cells 711, 711, . . . and the first information "1" in the test memory cell 712.

Eighth Embodiment

The eighth embodiment of the invention will now be described. In describing the eighth embodiment, mention will be made of a semiconductor memory having a redundant memory cell row and capable of being verified for the use or the nonuse of that redundant memory cell row.

Figure 10:
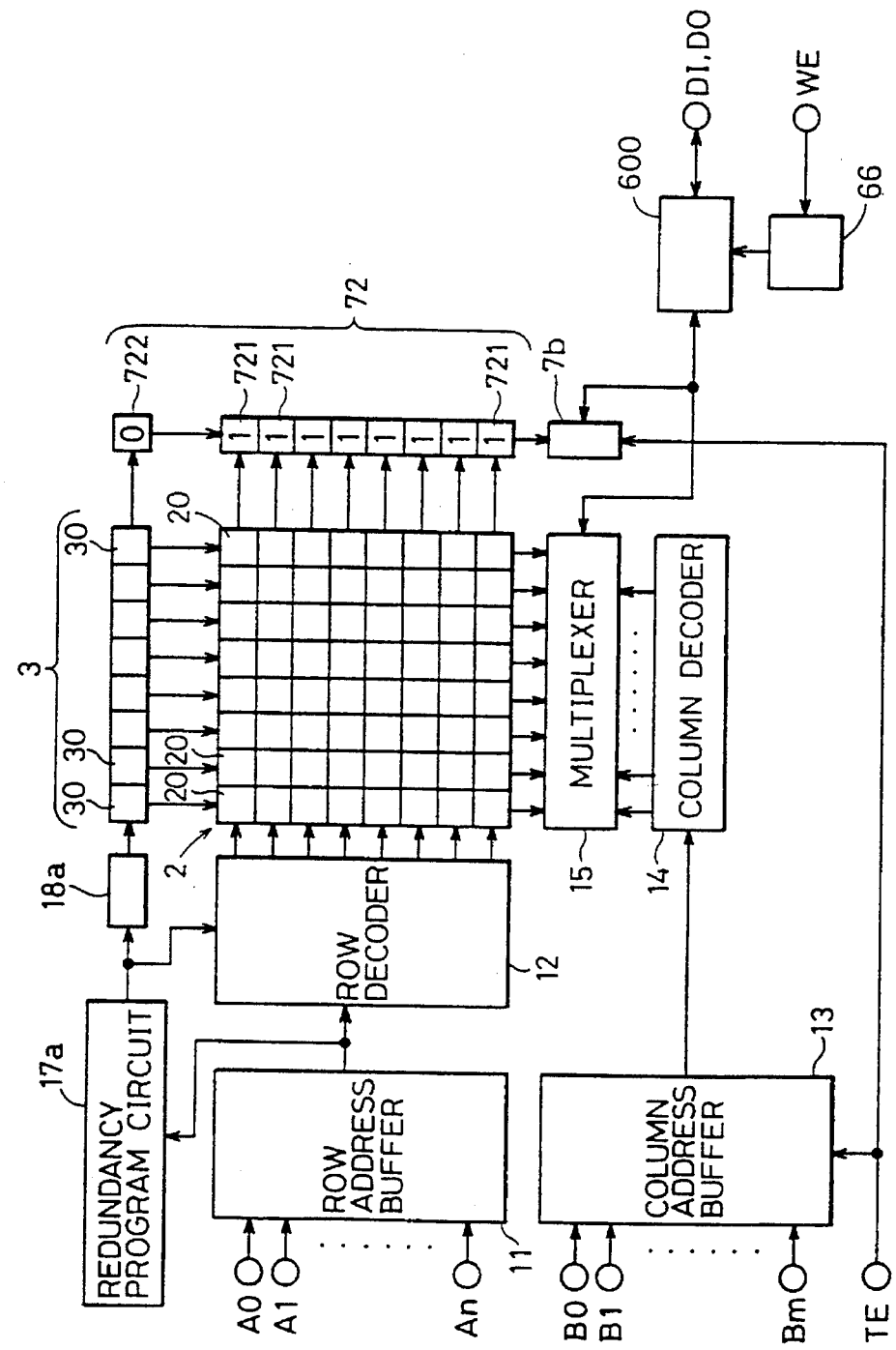
FIG. 10 is a block diagram of a semiconductor memory having redundant memory cells and practiced as an eighth embodiment of the invention.

FIG. 10 is a block diagram of a semiconductor memory having redundant memory cells and practiced as the eighth embodiment of the invention. Of the component parts of the semiconductor memory in FIG. 10, those also shown in FIG. 9 are designated by like reference numerals and their descriptions are omitted where redundant.

The difference between the eighth embodiment of FIG. 10 and the semiconductor memory of FIG. 9 is as follows: the eighth embodiment does not have the redundancy program circuit 17b, redundant column decoder 18b or redundant memory cell column 4, but includes the redundancy program circuit 17a, redundant row decoder 18a and redundant memory cell row 3. In addition, the eighth embodiment does not include the test mode row decoder 7a and the test mode memory cell row 71 but comprises a test mode multiplexer 7b and a test mode memory cell column 72. The test mode signal TE is sent not to the row address buffer 11 but to the column address buffer 13 and to the test mode multiplexer 7b.

The redundancy program circuit 17a and redundant row decoder 18a are functionally identical to their counterparts in FIG. 1. The redundant memory cell row 3 is composed of a plurality of redundant memory cells 30, 30, etc. The redundant memory cell row 3 replaces a defective memory cell row that may occur in the memory cell array 2.

Suppose that a defective memory cell row corresponding to a certain row address does occur in the memory cell array 2. In that case, the defective row of the row address in question is replaced by the redundant memory cell row 3.

The test mode multiplexer 7b selects the test mode memory cell column 72 in response to the test mode signal TE. The test mode memory cell column 72 comprises two kinds of test memory cells: test memory cells 721, 721, having previously stored first information "1," and a test memory cell 722 having previously stored second information "0." The test memory cells 721, 721, . . . and 722 have their stored information fixed therein. These test memory cells 721, 721, . . . and 722 constitute part of a row each.

The test memory cells 721, 721, . . . are furnished to correspond respectively with the memory cell rows of the memory cell array 2 on a one-to-one basis. The test memory cell 722 is provided to correspond with the redundant memory cell row 3.

If the test mode signal TE is inactive, the column address buffer 13 is activated and the test mode multiplexer 7b inactivated. If the test mode signal TE is active, the column address buffer 13 is inactivated and the test mode multiplexer 7b activated.

How the eighth embodiment of FIG. 10 works will now be described.

(1) In normal mode

In the normal mode, the test mode signal TE is made inactive. Because the inactive test mode signal TE inactivates the test mode multiplexer 7b, the test mode memory cell column 72 is not selected. Meanwhile, the column address buffer 13 is activated. This allows the eighth embodiment to perform normal read and write operations.

(2) In test mode

In the test mode, read operations are carried out. This requires activating the test mode signal TE; the column address buffer 13 is inactivated accordingly. Thus no memory cell column in the memory cell array 2 is selected. With the test mode multiplexer 7b activated, only the test mode memory cell column 72 is selected.

Meanwhile, the row addresses are selected by turns. Thus in the test mode, data is read from the test mode memory cell column 72 in conjunction with each of the row addresses selected.

Where the redundant memory cell row 3 is not used, the stored information is read from each of the test memory cells 721, 721, . . . in the test mode. That is, the first stored information "1" alone is retrieved if the redundant memory cell row 3 is not in use.

When the redundant memory cell row 3 is utilized, it means that a defective memory cell row has been replaced thereby. For the row address of the replaced row, the second stored information "0" is retrieved from the test memory cell 722.

Thus with the redundant memory cell row 3 in use, only the information retrieved with respect to the row address of the replaced row turns out to be "0." This means that, on the basis of the stored information retrieved in the test mode, it is possible to verify the use or the nonuse of the redundant memory cell row 3 and to identify the memory cell row replaced by the redundant memory cell row 3.

With the eighth embodiment, the first information "1" is stored in the test memory cells 721, 721, . . . and the second information "0" in the test memory cell 722. However, this is not limitative of the invention. Alternatively, the second information "0" may be stored in each of the test memory cells 721, 721, . . . and the first information "1" in the test memory cell 722.

What follows is a description of the ninth and the tenth embodiment of the invention, each embodiment being that type of semiconductor memory which is disclosed in "A 7-ns 1-Mb BiCMOS ECL SRAM with Shift Redundancy," IEEE Journal of Solid-State Circuits, Vol. 26, No. 4, April 1991. These embodiments have a shift redundancy circuit each and are capable of being verified for any memory cell row or column being replaced by a redundant row or column.

This type of semiconductor memory equipped with such a shift redundancy circuit adopts a redundancy system whereby a memory cell row or column containing defective memory cells that have occurred is replaced with the adjacent memory cell row or column.

Ninth Embodiment

The ninth embodiment of the invention will now be described. In describing the ninth embodiment, mention will be made of a semiconductor memory in which the memory cell column including faulty memory cells is replaced with the redundant column by shifting the appropriate memory cell columns; the semiconductor memory is arranged so that a check is made on whether or not the memory cell column shift has been carried out.

Figure 11:
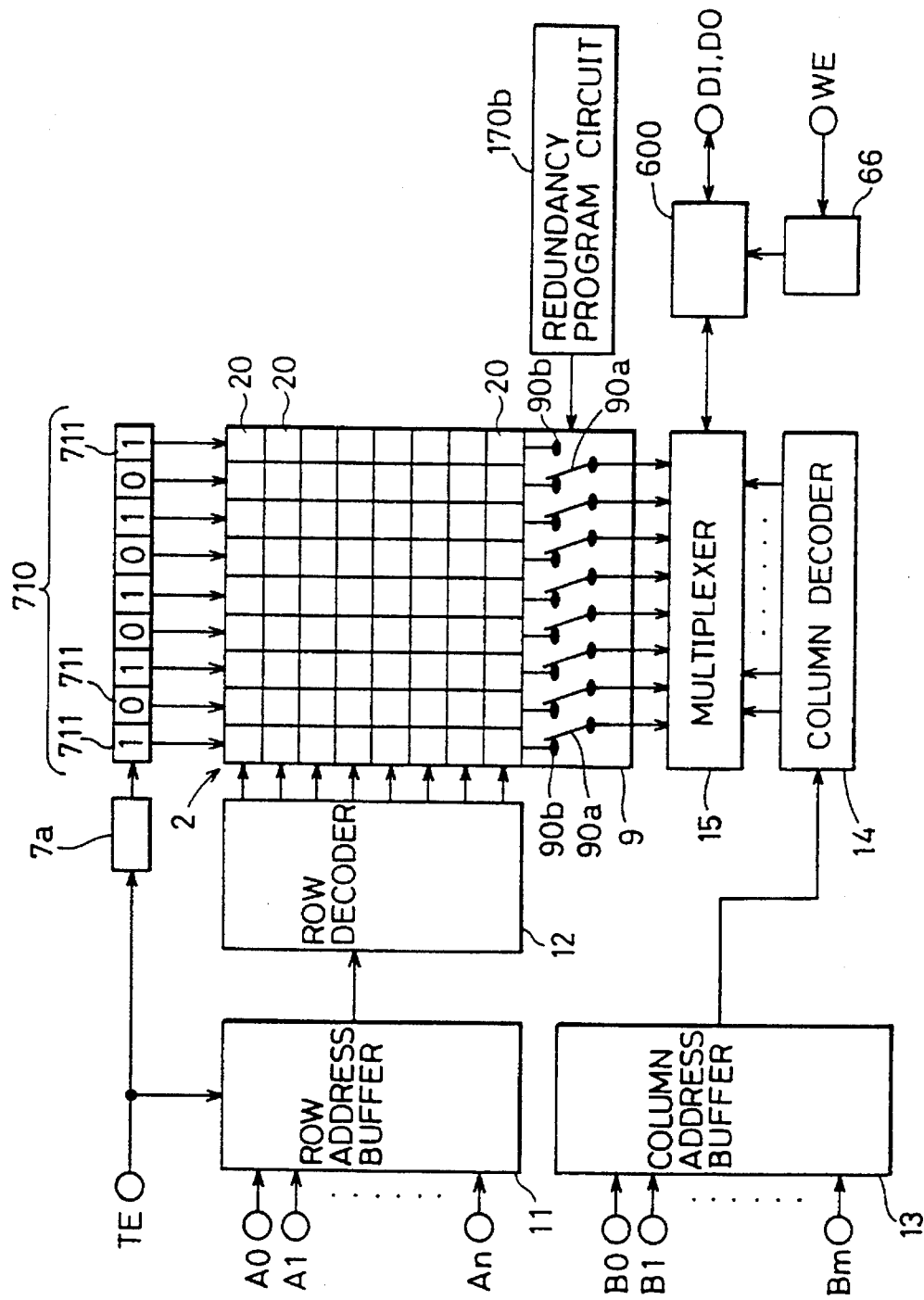
FIG. 11 as a block diagram of a semiconductor memory having a shift redundancy circuit and practiced as a ninth embodiment of the invention.

FIG. 11 is a block diagram of a semiconductor memory having a shift redundancy circuit and practiced as the ninth embodiment of the invention. Of the component parts of the semiconductor memory in FIG. 11, those also shown in FIG. 9 are designated by like reference numerals and their descriptions are omitted where redundant.

The difference between the ninth embodiment of FIG. 11 and the semiconductor memory of FIG. 9 is as follows: the ninth embodiment does not include the redundancy program circuit 17b, redundant column decoder 18b, redundancy multiplexer 19 and redundant memory cell column 4, and comprises a shift redundancy circuit 9 and a redundancy program circuit 170b. The memory cell array 2 has more memory cell columns than all selectable column addresses. Furthermore, a test mode memory cell row 710 replaces the test mode memory cell row 71.

The shift redundancy circuit 9 includes a plurality of movable contacts 90a, 90a, . . . and a plurality of fixed contacts 90b, 90b, etc. The movable contacts 90a, 90a, . . . are provided to correspond respectively with the column addresses selected by the multiplexer 15. The fixed contacts 90b, 90b, . . . are furnished to correspond respectively with the memory cell columns in the memory cell array 2. Each of the movable contacts 90a is switched between two adjacent fixed contacts 90b, 90b.

In the shift redundancy circuit 9, each of all movable contacts 90a remains switched to the adjacent left-hand side fixed contact 90b if there is no defect in the memory cell array 2. Thus in FIG. 11, the rightmost memory cell column is not used where no defect exists in the memory cell array 2.

The redundancy program circuit 170b has a programmed column address of a defective memory cell column. The redundancy program circuit 170b sets the shift redundancy circuit 9 so that the column address of a defective memory cell column and all addresses on the right-hand side thereof are each switched to the adjacent right-hand side column address. This causes the defective memory cell column to be replaced by another memory cell column.

The test mode memory cell row 710 is composed of a plurality of test memory cells 711, 711, etc. The test memory cells 711, 711, . . . are furnished to correspond respectively with the memory cell columns of the memory cell array 2.

Each of the test memory cells 711, 711, . . . has previously stored information different from the information held in the adjacent cells. For example, as shown in FIG. 11, the test memory cells 711, 711, . . . have first information "1" and second information "0" stored alternately therein. The two kinds of information are stored fixedly in the test memory cells.

How the ninth embodiment of FIG. 11 works will now be described.

(1) In normal mode

In the normal mode, the test mode signal TE is inactivated. This in turn inactivates the test mode row decoder 7a, which prevents the test mode memory cell row 710 from being selected. Because the row address buffer 11 is activated here, normal read and write operations are carried out.

(2) In test mode

In the test mode, read operations are carried out. In this case, the test mode signal TE is activated. This inactivates the row address buffer 11, thereby preventing the memory cell rows in the memory cell array 2 from being selected. Then with the test mode memory cell row 7a activated, only the test mode memory cell row 710 is selected.

Meanwhile, the column addresses are selected by turns. Thus in the test mode, data is read from the test mode memory cell row 710 in conjunction with each of the column addresses selected.

Where no memory cell column is replaced by the shift redundancy circuit 9, the stored information retrieved from the test mode memory cell row 710 appears arranged in regular fashion, illustratively "1, 0, 1, 0, . . ."

If a defective memory cell column has been replaced by the shift redundancy circuit 9, the stored information retrieved from the test mode memory cell row 710 appears arranged in irregular fashion, such as "1, 0, 1, 1, 0, . . . "

Thus on the basis of the stored information retrieved in the test mode, it is possible to verify the use or the nonuse of the redundant memory cell column and to identify the defective memory cell column replaced by the redundant column.

With the ninth embodiment, the shift redundancy circuit gets each of the selected memory cell columns replaced by the adjacent right-hand side column if a defective memory cell column exists. Alternatively, this invention also applies to a shift redundancy circuit for having each of the appropriate memory cell column replaced by the adjacent left-hand side column.

Tenth Embodiment

The tenth embodiment of the invention will now be described. In describing the tenth embodiment, mention will be made of a semiconductor memory in which the memory cell row including faulty memory cells is replaced with the redundant cell by shifting the appropriate memory cell columns; the semiconductor memory is arranged so that a check is made on whether or not the memory cell row shift has been carried out.

Figure 12:
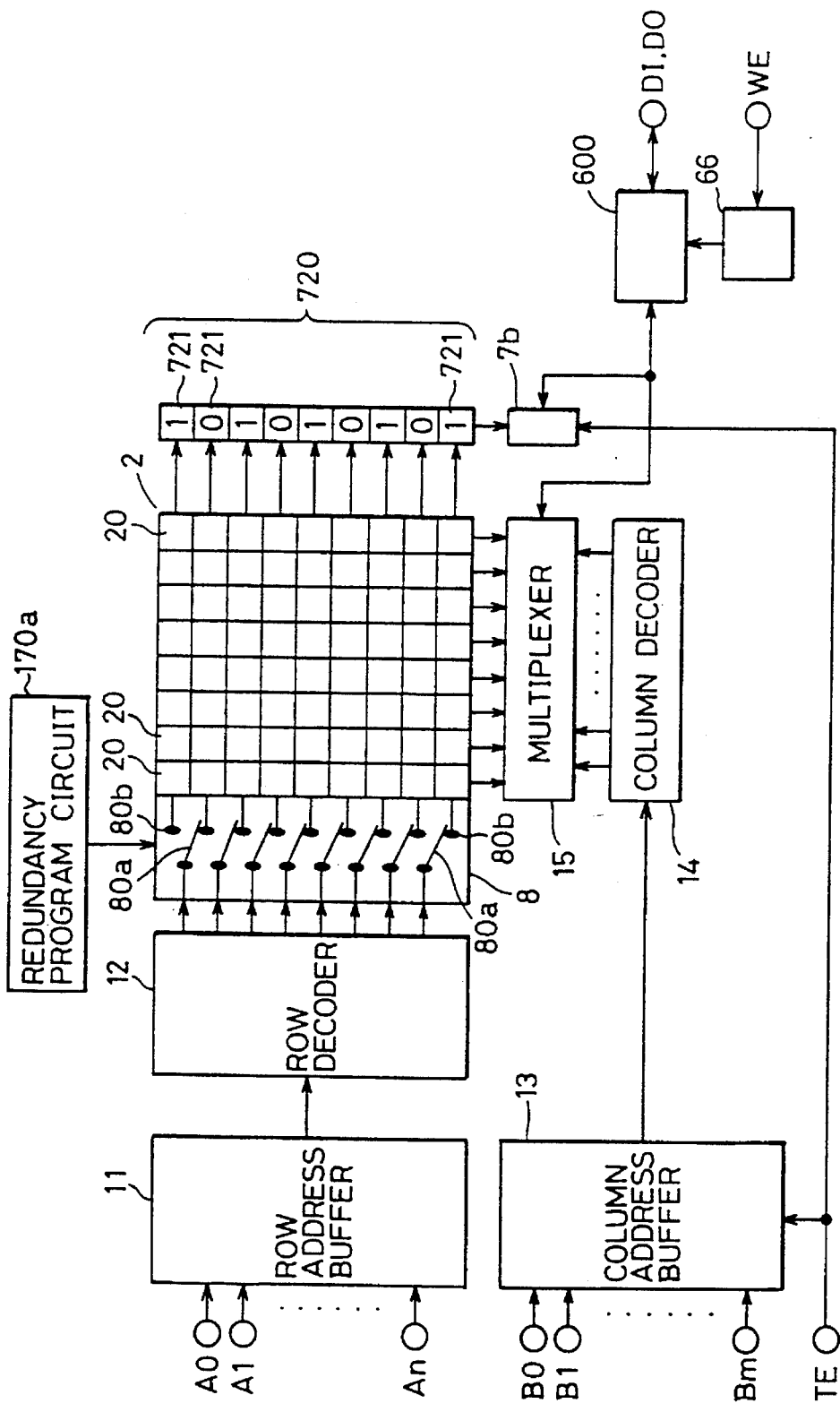
FIG. 12 is a block diagram of a semiconductor memory having a shift redundancy circuit and practiced as a tenth embodiment of the invention.

FIG. 12 is a block diagram of a semiconductor memory having a shift redundancy circuit and practiced as the tenth embodiment of the invention. Of the component parts of the semiconductor memory in FIG. 12, those also shown in FIG. 10 are designated by like reference numerals and their descriptions are omitted where redundant.

The difference between the tenth embodiment of FIG. 12 and the semiconductor memory of FIG. 10 is as follows: the tenth embodiment does not include the redundancy program circuit 17a, redundant row decoder 18a and redundant memory cell row 3, and comprises a shift redundancy circuit 8 and a redundancy program circuit 170a. The memory cell array 2 has more memory cell rows than all selectable row addresses. Furthermore, a test mode memory cell column 720 replaces the test mode memory cell column 72.

The shift redundancy circuit 8 includes a plurality of movable contacts 80a, 80a, . . . and a plurality of fixed contacts 80b, 80b, etc. The movable contacts 80a, 80a, are provided to correspond respectively with the row addresses selected by the row decoder 12.

The fixed contacts 80b, 80b, . . . are furnished to correspond respectively with the memory cell rows in the memory cell array 2. Each of the movable contacts 80a is switched between two adjacent fixed contacts 80b and 80b.

In the shift redundancy circuit 8, each of all movable contacts 80a remains switched to the adjacent lower-side fixed contact 80b if there is no defect in the memory cell array 2. Thus in FIG. 12, the uppermost memory cell row is not used where no defect exists in the memory cell array 2.

The redundancy program circuit 170a has a programmed row address of a defective memory cell row. The redundancy program circuit 170a sets the shift redundancy circuit 8 so that the row address of a defective memory cell row and all addresses on the upper side thereof are each switched to the adjacent upper-side row address. This causes the defective memory cell row to be replaced by another memory cell row.

The test mode memory cell column 720 is composed of a plurality of test memory cells 721, 721, etc. The test memory cells 721, 721, . . . are furnished to correspond respectively with the memory cell rows of the memory cell array 2. Each of the test memory cells 721, 721, . . . has previously stored information different from the information held in the adjacent cells. For example, the test memory cells 721, 721, . . . have 1's and 0's stored alternately and fixedly therein ("1, 0, 1, 0, . . . ).

How the tenth embodiment of FIG. 12 works will now be described.

(1) In normal mode

In the normal mode, the test mode signal TE is inactivated. This in turn inactivates the test mode multiplexer 7b, which prevents the test mode memory cell column 720 from being selected. Because the column address buffer 13 is activated here, normal read and write operations are carried out.

(2) In test mode

In the test mode, read operations are carried out. In this case, the test mode signal TE is activated. This inactivates the column address buffer 13, thereby preventing the memory cell columns in the memory cell array 2 from being selected. With the test mode multiplexer 7b then activated, only the test mode memory cell column 720 is selected.

Meanwhile, the row addresses are selected by turns. Thus in the test mode, data is read from the test mode memory cell column 720 in conjunction with each of the row addresses selected.

Where no memory cell row is replaced by the shift redundancy circuit 8, the stored information retrieved from the test mode memory cells 721, 721, . . . appears arranged in regular fashion, illustratively "1, 0, 1, 0, . . . "

If a defective memory cell row has been replaced by the shift redundancy circuit 8, the stored information retrieved from the test mode memory cells 721, 721, . . . appears arranged in irregular fashion, such as "1, 0, 1, 1, . . . "

Thus on the basis of the stored information retrieved in the test mode, it is possible to verify the use or the nonuse of the redundant memory cell row and to identify the defective memory cell row replaced by the redundant row.

With the tenth embodiment, the shift redundancy circuit gets each of the selected memory cell rows replaced by the adjacent upper-side row if a defective memory cell row exists. Alternatively, this invention also applies to a shift redundancy circuit for having each of the appropriate memory cell rows replaced by the adjacent lower-side row.

Eleventh Embodiment

The eleventh embodiment of the invention will now be described. In describing the eleventh embodiment, mention will be made of a semiconductor memory comprising a test mode signal generation circuit capable of internally generating the test mode signal TE for use within the memory. This type of semiconductor memory may be any one of those shown in FIGS. 9 through 20.

Figure 13:
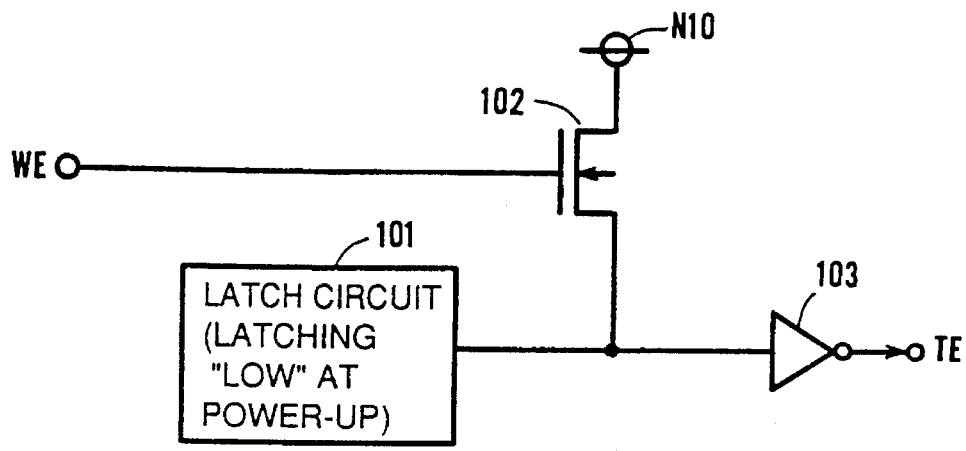
FIG. 13 is a circuit diagram of a test mode signal generation circuit constituting part of an eleventh embodiment of the invention.

FIG. 13 is a circuit diagram of a test mode signal generation circuit constituting part of the eleventh embodiment of the invention. Referring to FIG. 13, the test mode signal generation circuit includes a latch circuit 101, an NMOS transistor 102 and an inverter 103.

The power supply node N10 receives the supply potential VCC. The output signal of the latch circuit 101 is inverted by the inverter 103. The inverted signal is output as the test mode signal TE. The gate of the transistor 102 receives the read/write control signal WE. The transistor 102 is connected interposingly between two nodes, one node being the power supply node N10, the other node being the one located between the latch circuit 101 and the inverter 103. The read/write control signal WE is driven Low for a read operation and brought High for a write operation.

Upon power-up, the receipt of the supply potential VCC causes the latch circuit 101 to keep its output signal Low. Thereafter, the latch circuit 101 latches the level of the potential transmitted from the transistor 102.

The test mode signal generation circuit of FIG. 13 works as follows: when power is applied and the supply potential VCC is received, the latch circuit 101 holds its output signal Low. Immediately after power-up, a read mode is selected. This drives the read/write control signal WE Low, so that the transistor 102 remains off. In this case, the test mode signal is High and active.

The read mode is subsequently replaced by a write mode in which the read/write control signal WE is brought High. This turns on the transistor 102, thereby feeding the supply potential VCC to the latch circuit 101 and inverter 103. Thus the latch circuit 101 maintains its output signal at the high level, while the test mode signal TE is driven Low.

The test mode signal TE is now Low and inactive. After this, the latch circuit 101 keeps its output signal High, thereby keeping the test mode signal TE inactive until the next power-up.

As described, the test mode signal TE is activated only in the read mode immediately after power-up. In the write mode that follows, the test mode signal TE is inactivated. The test mode signal TE remains inactive until power is applied again.

The reason for limiting the period in which the test mode signal TE is active is as follows: in a volatile memory, all stored information is destroyed when power is removed. Thus if information is read from such a memory immediately after power-up, the retrieved information is unpredictable.

While such unpredictable information is being output, it matters little if the stored information is output from the test mode memory cell row and column. For this reason, the test mode signal TE is generated automatically in the read mode immediately after power-up.

When this type of test mode signal generation circuit is incorporated in the semiconductor memory, there is no need to supply the memory with the test mode signal TE from the outside.

Twelfth Embodiment

The twelfth embodiment of the invention will now be described. In describing the twelfth embodiment, mention will be made of another type of test mode signal generation circuit.

Figure 14:
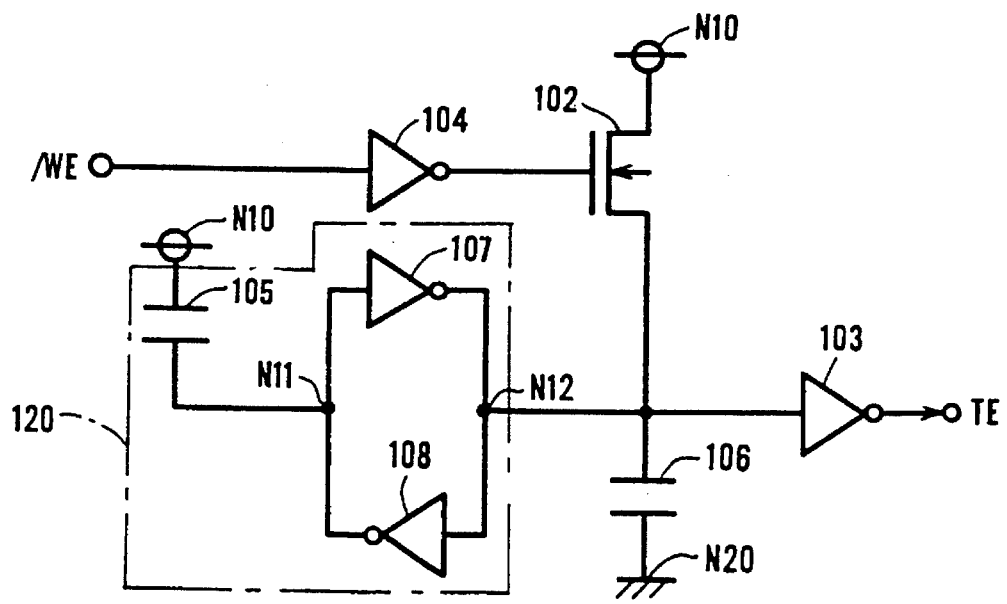
FIG. 14 is a circuit diagram of a test mode signal generation circuit constituting part of a twelfth embodiment of the invention.

FIG. 14 is a circuit diagram of a test mode signal generation circuit constituting part of the twelfth embodiment of the invention. This test mode signal generation circuit comprises an NMOS transistor 102, inverters 103, 104, 107 and 108, and capacitors 105 and 106.

The transistor 102 and the capacitor 106 are connected interposingly between the power supply node N10 and the grounding node N20. A read/write control signal /WE is fed to the gate of the transistor 102 via the inverter 104. The read/write control signal/WE has the polarity opposite to that of the signal WE. The inverters 107 and 108 have their input and output terminals interconnected.

The capacitor 105 is connected interposingly between the power supply node N10 on the one hand, and the node N11 between the output terminal of the inverter 108 and the input terminal of the inverter 107 on the other. The node N12 between the output terminal of the inverter 107 and the input terminal of the inverter 108 is connected to the node located between the transistor 102, the capacitor 106 and the inverter 103.

It follows that the test mode signal TE has the inverted level of the potential found on the node N12. The read/write control signal/WE is driven High for a read operation and brought Low for a write operation.

The test mode signal generation circuit of FIG. 14 works as follows: when power is applied and the supply potential VCC is received, the node Nil is brought High by means of the capacitive coupling with the capacitor 105; the node N12 is driven Low by means of the capacitive coupling with the capacitor 106.

Immediately after power-up, a read mode is selected. This drives High the read/write control signal/WE, so that the transistor 102 remains off. The latch circuit 120 thus keeps its output signal Low free from the effects of the potential transmitted by the transistor 102. This brings the test mode signal TE High.

The read mode is subsequently replaced by a write mode in which the read/write control signal/WE is brought Low. This charges the capacitor 106 and drives the node N12 High. Then with the capacitor 105 discharged, the node N11 is brought Low.

The latch circuit 120 thus keeps its output signal at the high level. As a result, the test mode signal TE is brought Low and inactivated. Thus the test mode signal generation circuit of FIG. 14 functions in the same manner as the circuit of FIG. 13.

Thirteenth Embodiment

The thirteenth embodiment of the invention will now be described. In describing the thirteenth embodiment, mention will be made of yet another type of test mode signal generation circuit operating in the same manner as the test mode signal generation circuit of FIG. 14.

Figure 15:
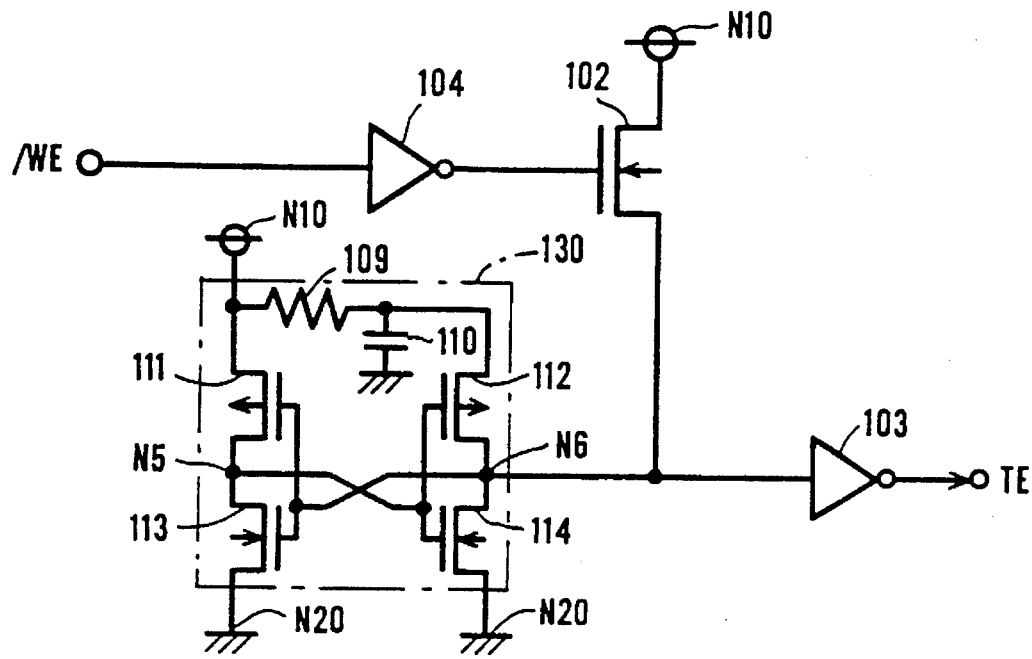
FIG. 15 is a circuit diagram of a test mode signal generation circuit constituting part of a thirteenth embodiment of the invention.

FIG. 15 is a circuit diagram of a test mode signal generation circuit constituting part of the thirteenth embodiment of the invention. Of the component parts of the circuit in FIG. 15, those also shown in FIG. 14 are designated by like reference numerals and their descriptions are omitted where redundant.

The difference between the test mode signal generation circuit of FIG. 15 and that of FIG. 14 is as follows: the circuit of FIG. 15 does not include the capacitors 105 and 106 and the inverters 107 and 108, and comprises a latch circuit 130.

The latch circuit 130 includes PMOS transistors 111 and 112, NMOS transistors 113 and 114, a resistor 109, and a capacitor 110. The transistors 111 and 113 are connected in a serial and interposing manner between the power supply node N10 and the grounding node N20. The resistor 109 and capacitor 110 are also connected in serial and interposing fashion between the power supply node N10 and the grounding node N20.

The transistors 112 and 114 are connected serially and interposingly between the grounding node N20 on the one hand, and the node between the resistor 109 and the capacitor 110 on the other. The gate of the transistor 112 and that of the transistor 114 are connected to the node N5 between the transistors 111 and 113.

The gate of the transistor 111 and that of the transistor 113 are connected to the node N6 between the transistors 112 and 114. The node N6 is in turn connected to the node between the transistor 102 and the inverter 103.

The test mode signal generation circuit of FIG. 15 works as follows: when the supply potential VCC is received, the node N5 is driven High and the node N6 Low. This is because the resistor 109 and the capacitor 110 cause the transistor 111 to switch on ahead of the transistor 112.

In that case, with the transistors 111 and 114 turned on, the node N5 is brought High and the node N6 Low.

Immediately after power-up, a read mode is selected. This leaves the transistor 102 turned off. As a result, the test mode signal TE is driven High and activated.

The read mode is subsequently replaced by a write mode in which the transistor 102 is turned on and the latch circuit 130 keeps its output signal High. Thus after the write mode is selected, the test mode signal TE is held Low and inactive. This means that the test mode signal generation circuit of FIG. 15 operates in the same manner as that of FIG. 14.

Fourteenth Embodiment

The fourteenth embodiment of the invention will now be described. In describing the fourteenth embodiment, mention will be made of a test mode signal generation circuit having a latch circuit that keeps its output signal High upon power-up.

Figure 16:
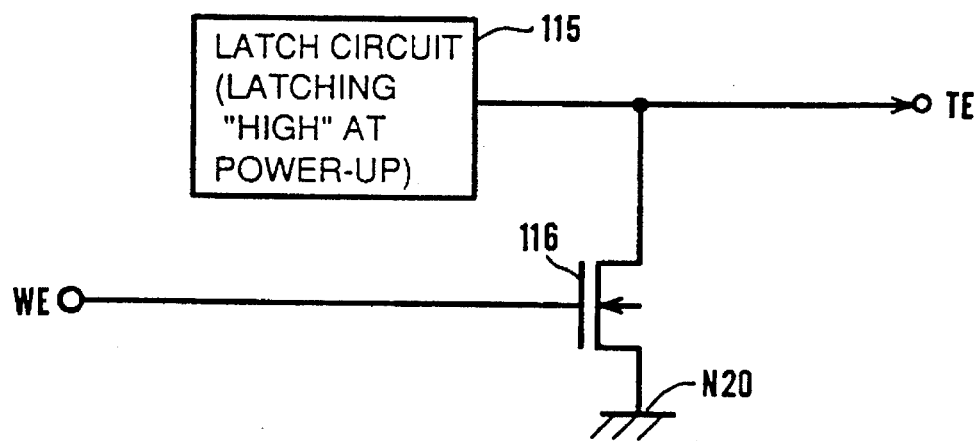
FIG. 16 is a circuit diagram of a test mode signal generation circuit constituting part of a fourteenth embodiment of the invention.

FIG. 16 is a circuit diagram of a test mode signal generation circuit constituting part of the fourteenth embodiment of the invention. Referring to FIG. 16, the test mode signal generation circuit comprises a latch circuit 115 and an NMOS transistor 116.

The output signal of the latch circuit 115 is output unmodified as the test mode signal TE. The gate of the transistor 116 receives the read/write control signal WE. The transistor 116 is connected interposingly between the latch circuit 115 and the grounding node N20.

The latch circuit 115 receives the supply potential VCC. When the supply potential is received upon-power-up, the latch circuit 115 keeps its output signal High. Thereafter, the latch circuit 115 latches the potential transmitted from the transistor 116.

The test mode signal generation circuit of FIG. 16 works as follows: when power is applied and the supply potential VCC is received, the latch circuit 115 keeps its output signal High. Immediately after power-up, a read mode is selected. The transistor 116 remains off because the read/write control signal WE is Low. In this case, the test mode signal TE is driven High and activated.

The read mode is subsequently replaced by a write mode in which the read/write control signal WE is brought High. This turns on the transistor 116 and feeds the latch circuit 115 with the grounding potential. The latch circuit 115 thus retains the low level. As a result, the test mode signal TE is driven Low and inactivated.

Fifteenth Embodiment

The fifteenth embodiment of the invention will now be described. In describing the fifteenth embodiment, mention will be made of a semiconductor memory in which the test memory cells 711, 712, 721 and 722 of FIGS. 9 through 12 and part of the memory cells 20 in the memory cell array are modified.

Figure 17:
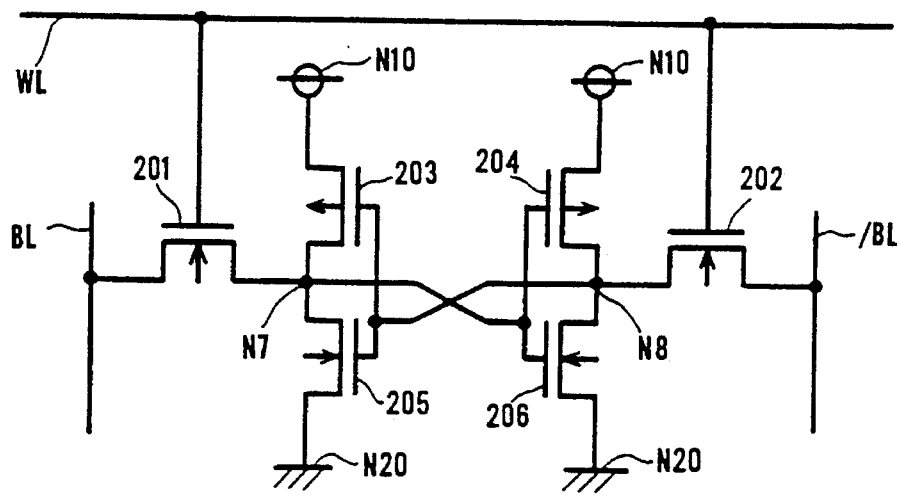
FIG. 17 is a circuit diagram of a typical memory cell structure in a memory cell array.

The memory cells 20 in the memory cell array 2 will be described first. FIG. 17 is a circuit diagram of a typical memory cell structure in the memory cell array 2. Referring to FIG. 17, this memory cell comprises access transistors 201 and 202 (NMOS transistors), load transistors 203 and 204 (TFT transistors), and driver transistors 205 and 206 (NMOS transistors).

The transistors 203 and 205 are connected in a serial and interposing manner between the power supply node N10 and the grounding node N20. The transistors 204 and 206 are also connected in serial and interposing fashion between the power supply node N10 and the grounding node N20.

The transistor 201 is connected interposingly between the bit line BL on the one hand, and a node N7, which is the storage node between the transistors 203 and 205, on the other. The transistor 202 is connected interposingly between the bit line/BL on the one hand, and a node N8, which is the storage node between the transistors 204 and 206, on the other. The gate of the transistor 201 and that of the transistor 202 are connected to the word line WL.

The memory cell arrangement of FIG. 17 works as follows: the node N7 is driven High when the load transistor 203 is turned on, and driven Low when the driver transistor 205 is turned on. The node N8 is brought High when the load transistor 204 is turned on, and brought Low when the driver transistor 206 is turned On.

The transistors 203, 204, 205 and 206 constitute a latch circuit. Thus the level of the node N7 differs from that of the node N8.

When the word line WL goes High, the access transistors 201 and 202 are both turned on. This connects the bit line BL to the node N7, and the bit line/BL to the node N8, allowing data to be written and read to and from the memory cell.

Described below is a plan-view wiring pattern layout of the memory cell in FIG. 17. For description, the layout will be divided between the upper and the lower layer.

Figure 18:
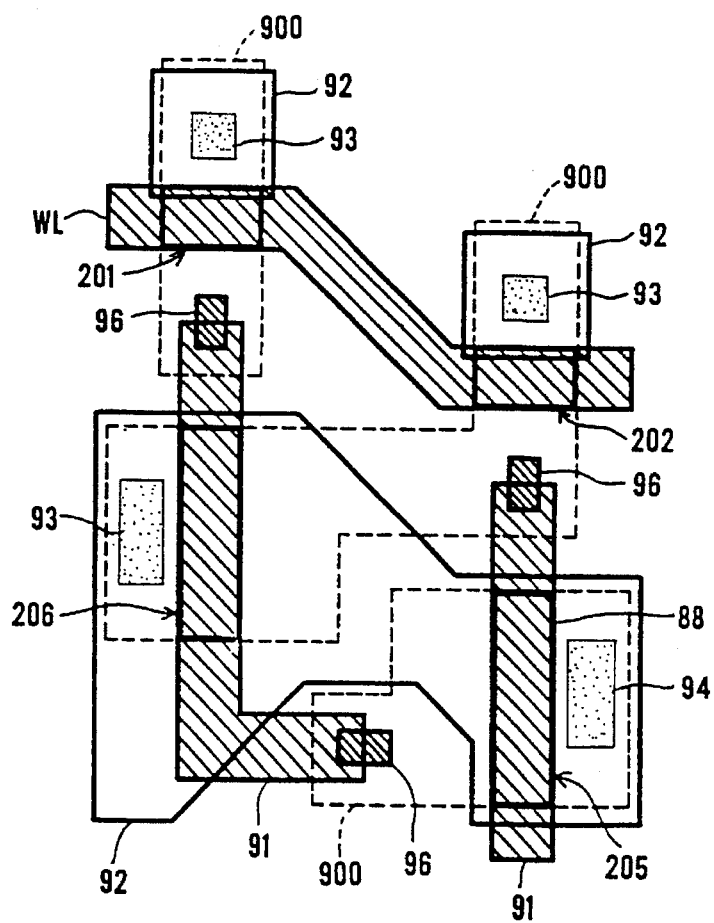
FIG. 18 is a plan view of the lower layer of a memory cell in a memory cell array.
Figure 19:
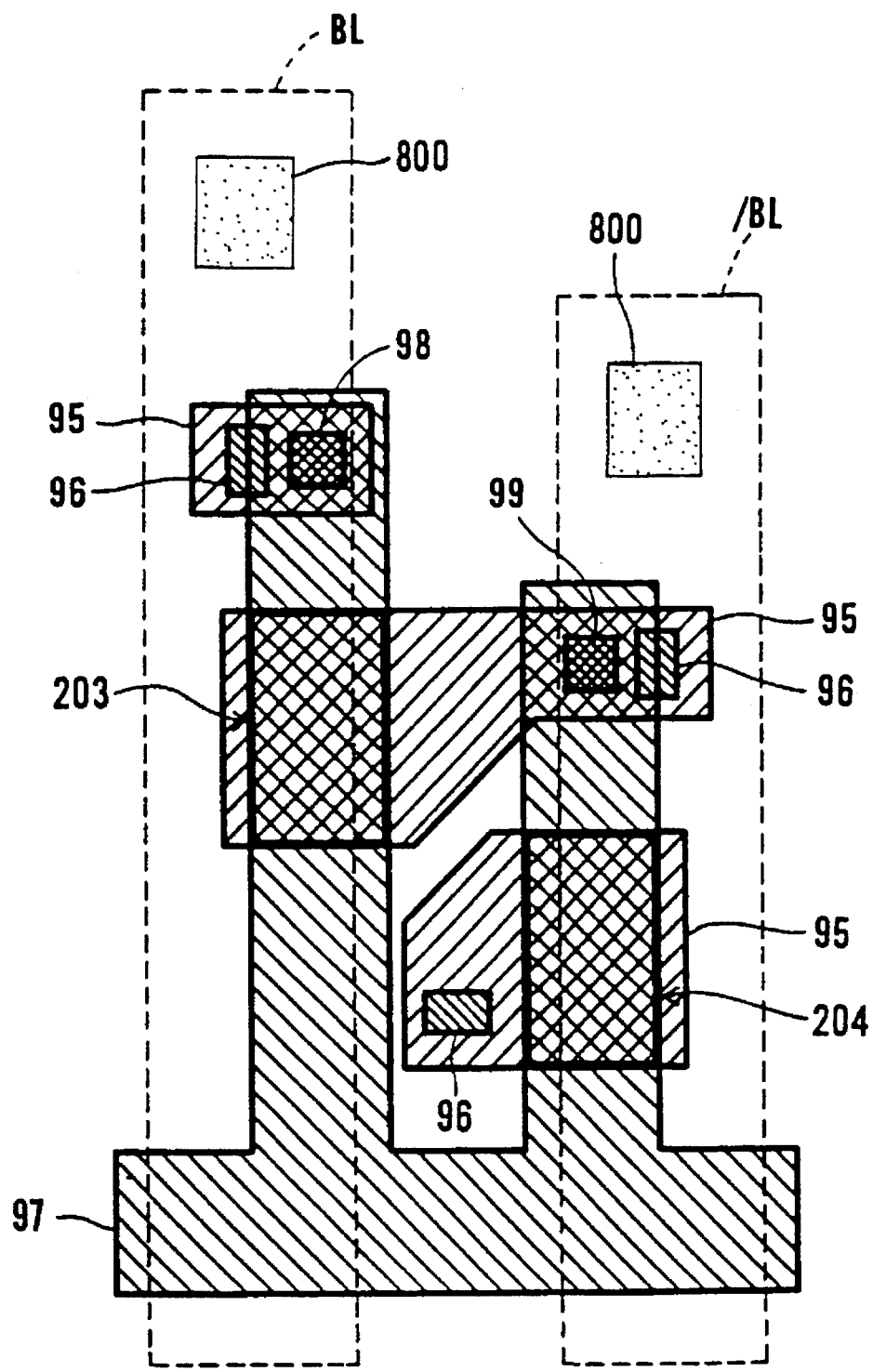
FIG. 19 is a plan view of the upper layer of a memory cell in a memory cell array.

FIG. 18 is a plan view of the lower layer of the memory cell. FIG. 19 is a plan view of the upper layer of the memory cell.

Referring first to FIG. 18, active regions 900 are formed on the main surface of the substrate. The word line WL and first polycrystal silicon layers 91 are deposited on the active regions 900.

Second polycrystal silicon layers 92 are formed on the first polycrystal silicon layers 91. The active regions 900 and the second polycrystal silicon layers 92 are interconnected electrically by way of first contacts 93 and 94.

The access transistors 201 and 202 are formed at the points of intersection between the word line WL and the active regions 900. The driver transistors 205 and 206 are formed at the points of intersection between the active regions 900 on the one hand, and the first polycrystal silicon layers 91 on the other.

Referring now to FIG. 19, third polycrystal silicon layers 95 are formed on top of the second polycrystal silicon layers 92.

The active regions 900, the first polycrystal silicon layers 91, and the third polycrystal silicon layers 95 are interconnected electrically by way of second contacts 96.

A fourth polycrystal silicon layer 97 is formed over the third polycrystal silicon layers 95. The third polycrystal silicon layers 95 and the fourth polycrystal silicon layer 97 are interconnected electrically via third contacts 98 and 99. The load transistors 203 and 204 are formed at the points of intersection between the third polycrystal silicon layers 95 on the one hand, and the fourth polycrystal silicon layer 97 on the other.

The bit lines BL and/BL are formed over the fourth polycrystal silicon layer 97. The second polycrystal silicon layers 92 and the bit lines BL and/BL are interconnected electrically via fourth contacts 800.

Figure 20:
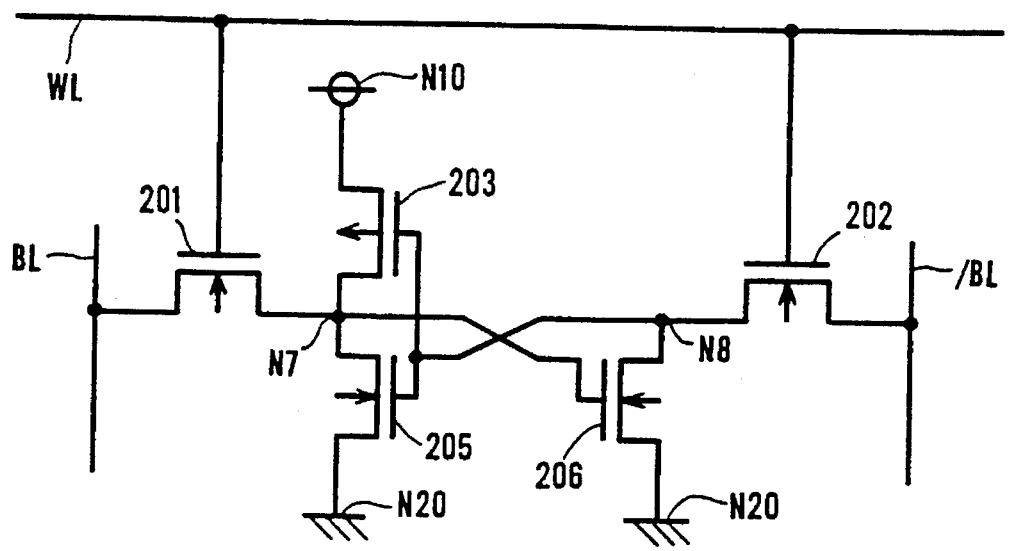
FIG. 20 is a circuit diagram of a test memory cell structure constituting part of a fifteenth embodiment of the invention.

What follows is a description of a typical test memory cell formed by partially modifying the memory cell structure described above. FIG. 20 is a circuit diagram of a test memory cell structure constituting part of the fifteenth embodiment of the invention. Of the component parts of the test memory cell in FIG. 20, those also shown in FIG. 17 are designated by like reference numerals and their descriptions are omitted where redundant.

The difference between the test memory cell of FIG. 20 and that of FIG. 17 is that the cell of FIG. 20 does not include the load transistor 204 for transmitting the high-level potential to the node NS. This structure is implemented by cutting off the fourth polycrystal silicon layer 97 of FIG. 19 at the point where the load transistor 204 is located.

In the test memory cell of FIG. 20, the absence of the load transistor 204 means that the node N8 is not fed with the high-level potential. That is, the node N8 remains Low. The low-level of the node N8 turns on the driver transistor 203. This keeps the node N7 always High. As a result, the stored information is fixed in the test memory cell of FIG. 20. Alternatively, the test memory cell may have the node N8 held High and the node N7 Low so as to keep the stored information fixed therein. This alternative structure is implemented by removing the load transistor 203 from the setup of FIG. 17.

Figure 21:
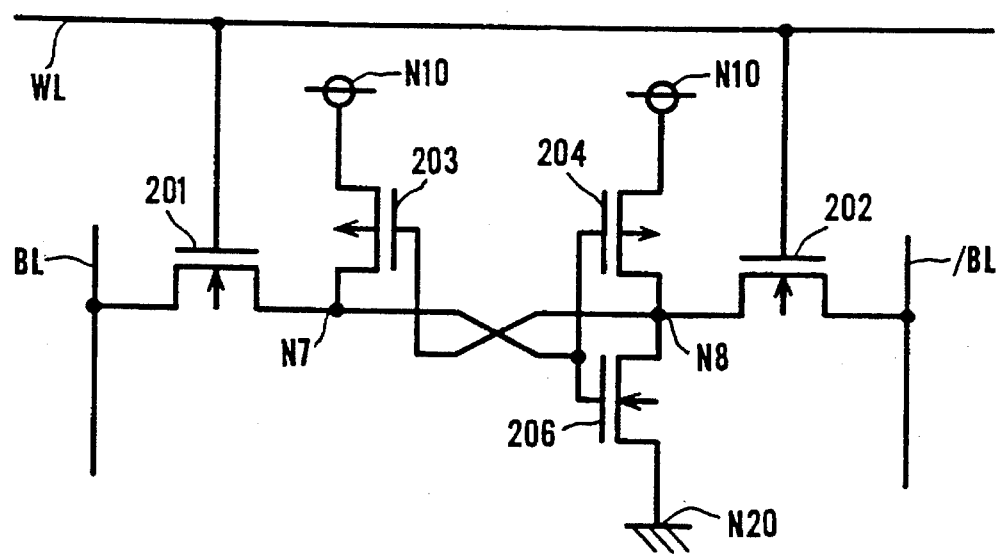
FIG. 21 is a circuit diagram of another test memory cell structure constituting part of the fifteenth embodiment.

Another example of the test memory cell will now be described. FIG. 21 is a circuit diagram of another test memory cell structure constituting part of the fifteenth embodiment.

The test memory cell of FIG. 21 differs from the memory cell of FIG. 17 in that the cell of FIG. 21 does not include the driver transistor 205 for transmitting the low-level potential to the node N7. This structure is implemented by cutting off the active region 900 of FIG. 18 at the point where the driver transistor 205 is located.

In the test memory cell of FIG. 21, the absence of the driver transistor 205 means that the node N7 is not fed with the low-level potential. That is, the node N7 remains High. The high-level of the node N7 turns on the driver transistor 206. This keeps the node N8 always Low. As a result, the stored information is fixed in the test memory cell of FIG. 21. Alternatively, the test memory cell may have the node N8 held High and the node N7 Low so as to keep the stored information fixed therein. This alternative structure is implemented by removing the driver transistor 206 from the setup of FIG. 17.

Sixteenth Embodiment

The sixteenth embodiment of the invention will now be described. In describing the sixteenth embodiment, mention will be made of a high resistance load type test memory cell. Below is a description of a test memory cell formed by partially modifying the high resistance load type memory cell.

The high resistance load type memory cell is structured illustratively by substituting high resistance loads for the load transistors 203 and 204 in FIG. 17.

Described below is a plan-view wiring pattern layout of the high resistance load type memory cell. For description, the layout will be divided between the upper and the lower layer.

The lower-layer layout of the high resistance load type memory cell is identical to that of FIG. 18 and will not be discussed further.

Figure 22:
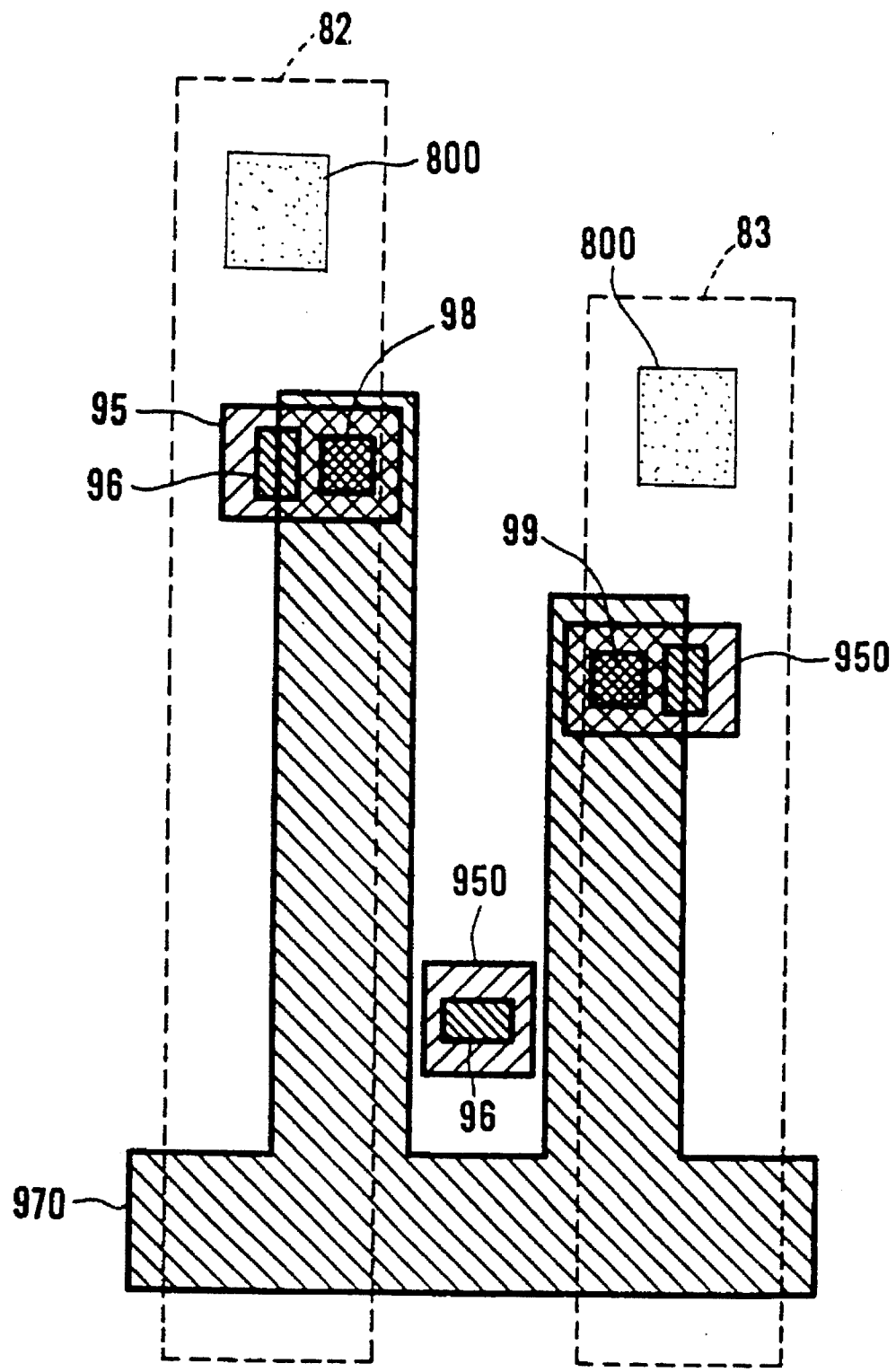
FIG. 22 is a plan view of the upper layer of a high resistance load type memory cell.

FIG. 22 is a plan view of the upper layer of the high resistance load type memory cell. The difference between the layout of FIG. 22 and that of FIG. 19 is as follows: the fourth polycrystal silicon layer 970 in FIG. 22 differs in terms of characteristic from the fourth polycrystal silicon layer in FIG. 19. That is, the fourth polycrystal silicon layer 970 constitutes a resistor.

The test memory cell of FIG. 22 does not include the transistors 203 and 204 shown in FIG. 18. This means that the third polycrystal silicon layers 950 differ in shape from the third polycrystal silicon layers in FIG. 19.

What follows is a description of a test memory cell formed by partially modifying the structure of the high resistance load type memory cell shown in FIG. 22.

Figure 23:
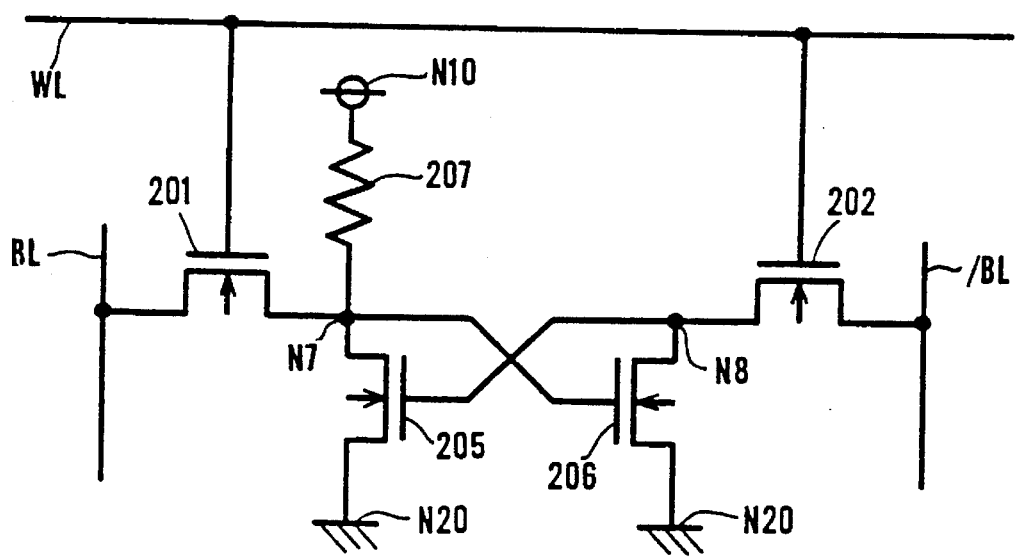
FIG. 23 is a circuit diagram of a test memory cell structure constituting part of a sixteenth embodiment of the invention.

FIG. 23 is a circuit diagram of a test memory cell structure constituting part of the sixteenth embodiment of the invention. Referring to FIG. 23, a high-resistance load 207 is connected interposingly between the power supply node N10 and the node N7. The high-resistance load 207 supplies a high-level potential to the node N7. The node N8 is not furnished with any high-resistance load such as those used in the high resistance load type memory cell.

This structure is implemented by cutting off a particular portion of the fourth polycrystal silicon layer 970 in FIG. 22; that particular portion is that which is connected to the third contact 99.

In the test memory cell of FIG. 23, the node N8 stays Low because it is not supplied with the high-level potential. The low-level of the node N8 turns off the transistor 205, thereby leaving the node N7 always High. In this manner, the test memory cell of FIG. 23 has its stored information fixed therein.

Figure 24:
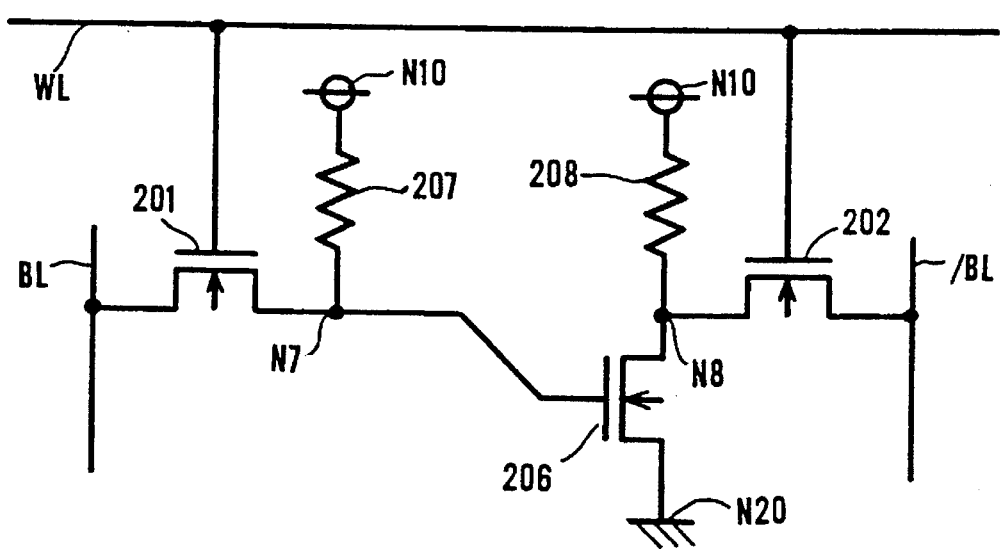
FIG. 24 as a circuit diagram of another test memory cell structure constituting part of the sixteenth embodiment.

Another example of the test memory cell will now be described. FIG. 24 is a circuit diagram of another test memory cell structure constituting part of the sixteenth embodiment. Referring to FIG. 24, a high-resistance load 208 is connected interposingly between the power supply node N10 and the node NS. It should be noted that the node N7 is not furnished with a driver transistor such as the transistor 205 shown in FIG. 23.

The structure above is implemented by cutting off the active region 900 of FIG. 18 at the point where the driver transistor 205 is located in the high resistance load type memory cell.

In the test memory cell of FIG. 24, the absence of the driver transistor 205 means that the node N7 is not supplied with the low-level potential. That is, the node N7 remains High. The high-level of the node N7 turns on the driver transistor 206. This keeps the node N8 always Low. As a result, the stored information is fixed in the test memory cell of FIG. 24.

Seventeenth Embodiment

The seventeenth embodiment of the invention will now be described. In describing the seventeenth embodiment, mention will be made of variations of the test memory cells shown in FIGS. 20 and 21.

Figure 25:
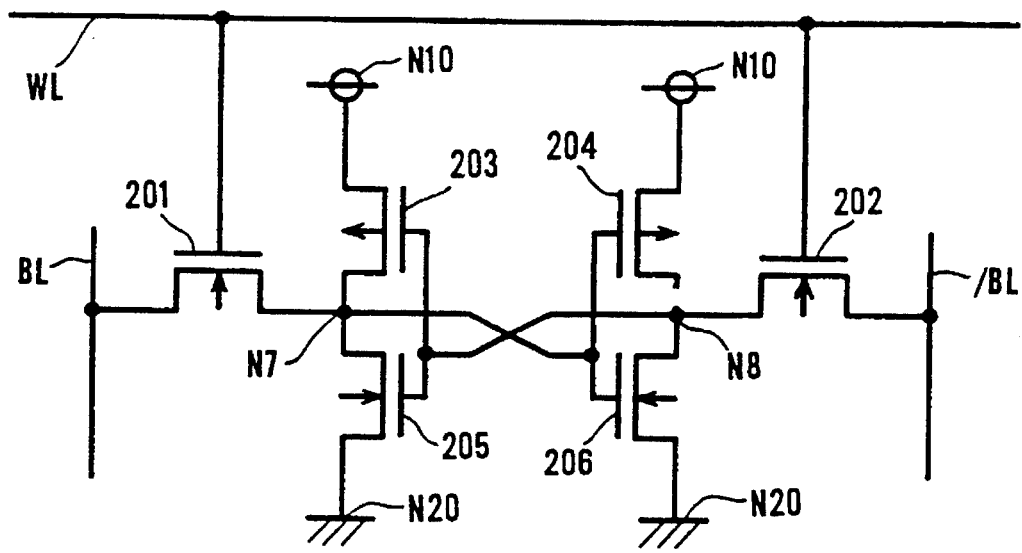
FIG. 25 as a circuit diagram of a test memory cell structure constituting part of a seventeenth embodiment of the invention.

FIG. 25 is a circuit diagram of a test memory cell structure constituting part of the seventeenth embodiment of the invention. The test memory cell of FIG. 25 has its stored information fixed in the same manner as the test memory cell of FIG. 20.

Referring to FIG. 25, the node N8 is not connected to the load transistor 204 in the test memory cell. That is, the node N8 is not supplied with the high-level potential. This allows the test memory cell of FIG. 25 to fix its stored information therein in the same fashion as the test memory cell of FIG. 20. This structure is implemented by removing the third contact 99 from the setup of FIG. 19.

Figure 26:
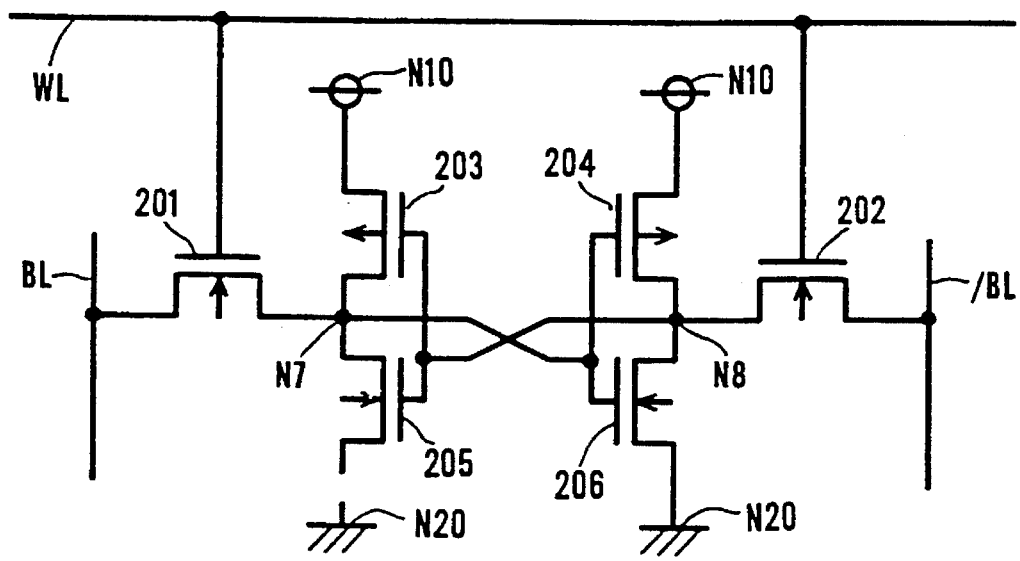
FIG. 26 is a circuit diagram of another test memory cell structure constituting part of the seventeenth embodiment.

FIG. 26 is a circuit diagram of another test memory cell structure constituting part of the seventeenth embodiment. The test memory cell of FIG. 26 has its stored information fixed in the same manner as the test memory cell of FIG. 21.

Referring to FIG. 26, the driver transistor 205 is not connected to the grounding node N20 in the test memory cell. That is, the node N7 is not supplied with the low-level potential. This allows the test memory cell of FIG. 26 to fix its stored information therein in the same fashion as the test memory cell of FIG. 21. This structure is implemented by removing the first contact 94 from the setup of FIG. 18.

Eighteenth Embodiment

The eighteenth embodiment of the invention will now be described. In describing the eighteenth embodiment, mention will be made of variations of the test memory cells shown in FIGS. 23 and 24.

Figure 27:
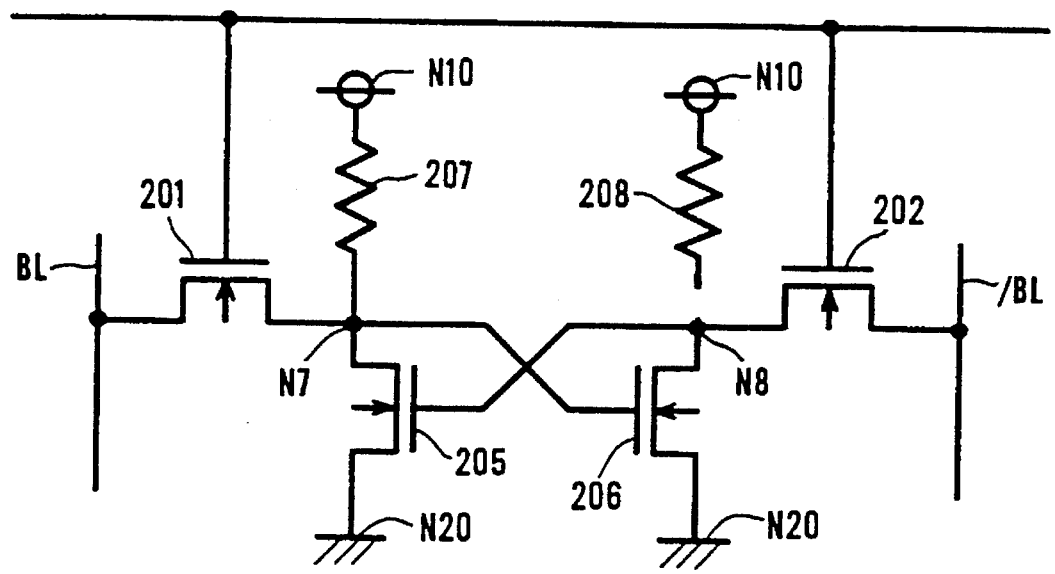
FIG. 27 is a circuit diagram of a test memory cell structure constituting part of an eighteenth embodiment of the invention.

FIG. 27 is a circuit diagram of a test memory cell structure constituting part of the eighteenth embodiment of the invention. The test memory cell of FIG. 27 has its stored information fixed in the same manner as the test memory cell of FIG. 23.

Referring to FIG. 27, the node N8 is not connected to the high-resistance load 208 in the test memory cell. That is, the node N8 is not supplied with the high-level potential. This allows the test memory cell of FIG. 27 to fix its stored information therein in the same fashion as the test memory cell of FIG. 23. This structure is implemented by removing the third contact 99 from the setup of FIG. 22 within the high resistance load type memory cell.

Figure 28:
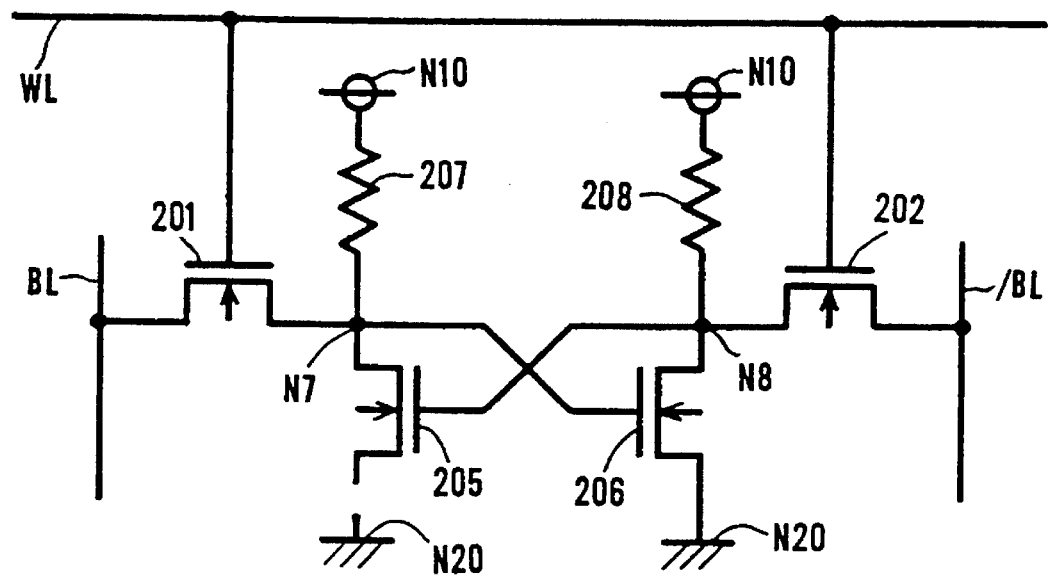
FIG. 28 as a circuit diagram of another test memory cell structure constituting part of the eighteenth embodiment.

FIG. 28 is a circuit diagram of another test memory cell structure constituting part of the eighteenth embodiment. The test memory cell of FIG. 28 has its stored information fixed in the same manner as the test memory cell of FIG. 24.

Referring to FIG. 28, the driver transistor 205 is not connected to the grounding node N20 in the test memory cell. This structure is implemented by removing the first contact 94 from the setup of FIG. 18 within the high resistance load type memory cell.

In this structure, the node N7 is not supplied with the low-level potential. Thus the test memory cell of FIG. 28 has its stored information fixed therein in the same fashion as the test memory cell of FIG. 24.

Nineteenth Embodiment

The nineteenth embodiment of the invention will now be described. In describing the nineteenth embodiment, mention will be made of a semiconductor memory having a test mode memory cell row and a test mode memory cell column for equalizing the wiring patterns of the memory cell array.

In the process of forming a memory cell array, there are bound to occur differences between the dense and the sparse wiring patterns in terms of finish sizes, especially pattern widths. The wiring pattern outside the memory cell array is sparse compared with the wiring pattern inside the array. This results in differences between the edge of the memory cell array and the inside thereof in terms of finish sizes, notably pattern widths.

One conventional measure for minimizing the differences in finish sizes involves disposing a superfluous wiring pattern outside the memory cell array so that the wiring pattern at the memory cell array edge will not become sparse. Because it requires adding the functionally unnecessary wiring pattern, the conventional measure has the disadvantage of having to increase needlessly the area in which the circuit is formed.

Figure 29:
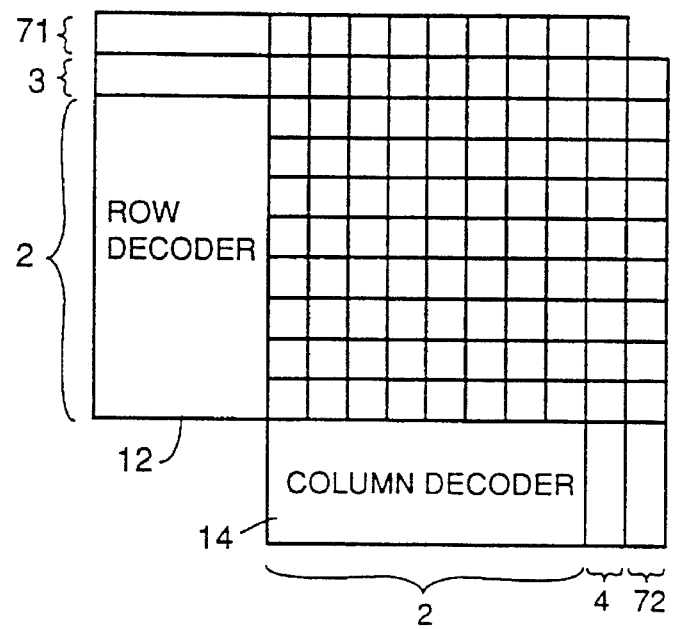
FIG. 29 is a block diagram of a semiconductor memory practiced as a nineteenth embodiment of the invention.
Figure 30:
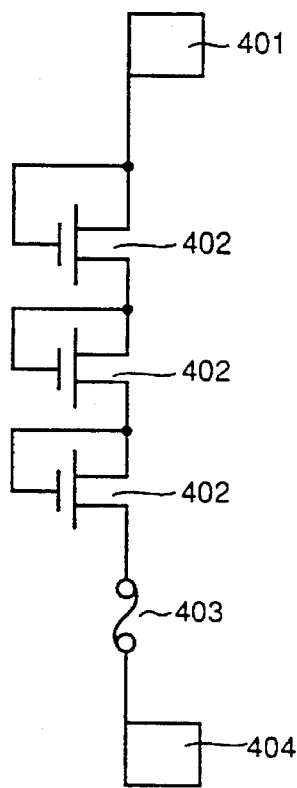
FIG. 30 is a circuit diagram of a redundant bit usage test circuit for use with a conventional semiconductor memory.

Described below is a semiconductor memory conducive to solving the above problem. FIG. 29 is a block diagram of such a semiconductor memory practiced as the nineteenth embodiment of the invention.

Referring to FIG. 29, the semiconductor memory comprises a memory cell array 2, a row decoder 12, a column decoder 14, a redundant memory cell row 3, a redundant memory cell column 4, a test mode memory cell row 71, and a test mode memory cell column 72.

The redundant memory cell row 3 and redundant memory cell column 4 are provided outside the memory cell array 2. The test mode memory cell row 71 is furnished outside the redundant memory cell row 3. The test mode memory cell column 72 is disposed outside the redundant memory cell column 4.

In this setup, the test mode memory cell row 71 and the test mode memory cell column 72, furnished as indicated, each play the role of the superfluous wiring pattern discussed above. The setup equalizes the wiring pattern finish sizes inside the memory cell array 2. Thus with the nineteenth embodiment of FIG. 29, it is possible to equalize the finish sizes such as the widths of the wiring patterns in the memory cell array 2.

As many apparently different embodiments of this invention may be made without departing from the spirit and scope thereof, it is to be understood that the invention is not limited to the specific embodiments thereof except as defined in the appended claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:

a memory cell array having a plurality of memory cells arranged in matrix fashion;

either a redundant memory cell row or a redundant memory cell column for replacing respectively either any one memory cell row or any one memory cell column in said memory cell array;

specific address detecting means for detecting the selection of a specific address in said memory cell array and for generating a detection signal upon the detection;

power supply nodes for receiving a supply potential;

status storing means for storing beforehand output status representing either the use or the nonuse of either said redundant memory cell row or said redundant memory cell column and for generating the stored output status in response to the receipt of said supply potential; and switching means for performing a switching operation, in response to said detection signal from said specific address detecting means, to output the output status generated by said status storing means when said specific address is selected, said output status serving as information indicating either the use or the nonuse of either said redundant memory cell row or said redundant memory cell column.

2. A semiconductor memory according to claim 1, wherein said status storing means includes fuse means for receiving said supply potential, stores output status representing either the use or the nonuse of either said redundant memory cell row or said redundant memory cell column depending on whether said fuse means has blown, and outputs the stored output status in response to the receipt of said supply potential.

3. A semiconductor memory according to claim 2, wherein said status storing means stores first output status representing the use of either said redundant memory cell row or said redundant memory cell column if said fuse means has blown, and stores second output status representing the nonuse of either said redundant memory cell row or said redundant memory cell column if said fuse means remains intact.

4. A semiconductor memory according to claim 1, further comprising:

word lines furnished to said memory cell array;

a row decoder for outputting a signal for selecting a row address in said memory array; and a column decoder for outputting a signal for selecting a column address in said memory array;

wherein said specific address detecting means receives the output signal of said row decoder via a signal line independent of said word lines, receives the output signal of said column decoder, and checks to see if said specific address is selected on the basis of the received signals.

5. A semiconductor memory according to claim 1, wherein said memory cells are a static memory cell each.

6. A semiconductor memory according to claim 1, wherein said memory cells are a dynamic memory cell each.

7. A semiconductor memory comprising:

a memory cell array having a plurality of memory cells arranged in matrix fashion;

a redundant memory cell row and a redundant memory cell column for replacing respectively any one memory cell row and any one memory cell column in said memory cell array;

specific address detecting means for detecting the selection of a specific address in said memory cell array and for generating a detection signal upon the detection;

power supply nodes for receiving a supply potential;

status storing means for storing beforehand output status representing either the use or the nonuse of said redundant memory cell row and said redundant memory cell column and for generating the stored output status in response to the receipt of said supply potential; and switching means for performing a switching operation, in response to said detection signal from said specific address detecting means, to output the output status generated by said status storing means when said specific address is selected, said output status serving as information indicating either the use or the nonuse of said redundant memory cell row and said redundant memory cell column.

8. A semiconductor memory according to claim 7, wherein said status storing means includes fuse means for receiving said supply potential, stores output status representing either the use or the nonuse of said redundant memory cell row and said redundant memory cell column depending on whether said fuse means has blown, and outputs the stored output status in response to the receipt of said supply potential.

9. A semiconductor memory according to claim 8, wherein said status storing means stores first output status representing the use of said redundant memory cell row and said redundant memory cell column if said fuse means has blown, and stores second output status representing the nonuse of said redundant memory cell row and said redundant memory cell column if said fuse means remains intact.

10. A semiconductor memory comprising:

a memory cell array having a plurality of memory cells arranged in matrix fashion;

a redundant memory cell row and a redundant memory cell column for replacing respectively any one memory cell row and any one memory cell column in said memory cell array;

a plurality of specific address detecting means associated respectively with specific addresses in said memory cell array, each of said specific address detecting means detecting the selection of one of said specific addresses and generating a detection signal upon the detection;

power supply nodes for receiving a supply potential;

a plurality of status storing means associated respectively with said specific address detecting means, each of said status storing means storing output status representing the usage status of said redundant memory cell row and said redundant memory cell column and generating the stored output status in response to the receipt of said supply potential; and a plurality of switching means associated respectively with said status storing means, each of said switching means performing a switching operation, in response to said detection signal from the corresponding specific address detecting means, to output the output status generated by the corresponding status storing means when the corresponding specific address is selected, said output status serving as information indicating the usage status of said redundant memory cell row and said redundant memory cell column.

11. A semiconductor memory according to claim 10, wherein each of said status storing means includes fuse means for receiving said supply potential, stores output status representing the usage status of said redundant memory cell row and said redundant memory cell column depending on whether said fuse means has blown, and outputs the stored output status in response to the receipt of said supply potential.

12. A semiconductor memory comprising:

power supply nodes for receiving a supply potential;

a redundant memory cell row and a redundant memory cell column; and a memory cell array including a memory cell at a specific address at which to store information about the use or the nonuse of said redundant memory cell row and said redundant memory cell column;

wherein the memory cell at said specific address has fuse means for receiving said supply potential, stores output status representing either the use or the nonuse of any redundant memory cells depending on whether said fuse means has blown, and outputs the stored output status in response to the receipt of said supply potential.

13. A semiconductor memory comprising:

a memory cell array having a plurality of memory cells arranged in matrix fashion;

a redundant memory cell column for replacing the memory cell column represented by any column address in said memory cell array; and a test mode memory cell row composed of a plurality of test memory cells associated respectively with the memory cell columns of said memory cell array and with said redundant memory cell column, wherein said test mode memory cell row has one kind of information stored beforehand in the test memory cell associated with said redundant memory cell column, and has another kind of information stored beforehand in each of the test memory cells associated with each column of said memory cell array; and a test mode row decoder for receiving a test mode signal representing a test mode and for selecting said test mode memory cell row in response to said test mode signal received in said test mode;

wherein, in said test mode, the column addresses of said memory cell array are selected by turns in order to retrieve the information stored in said test memory cells of said test mode memory cell row to check if said redundant memory cell column has replaced any memory cell column.

14. A semiconductor memory according to claim 13, further comprising:

power supply nodes for receiving a supply potential; and grounding nodes for receiving a grounding potential;

wherein each of the memory cells in said memory cell array includes:

a first and a second storage node;

a first driver transistor having the gate thereof connected to said second storage node, said first driving transistor being connected interposingly between said first storage node and said grounding nodes;

a second driver transistor having the gate thereof connected to said first storage node, said second driving transistor being connected interposingly between said second storage node and said grounding nodes;

first load means connected interposingly between said first storage node and said power supply nodes; and second load means connected interposingly between said second storage node and said power supply nodes;

wherein said plurality of test memory cells are constituted by a first test memory cell storing first information and by a second test memory cell storing second information different from said first information;

wherein each of said first and said second test memory cells includes:

a third and a fourth storage node;

a third driver transistor having the gate thereof connected to one of said third and said fourth storage node, said third driver transistor being connected interposingly between the other of said third and said fourth storage node on the one hand, and said grounding nodes on the other;

third load means connected interposingly between said third storage node and said power supply nodes; and fourth load means connected interposingly between said fourth storage node and said power supply nodes; and wherein the way in which said third driver transistor of each of said first test memory cells is connected to said third and said fourth storage node differs from the way in which said third driver transistor of said second test memory cell is connected to said third and said fourth storage node.

15. A semiconductor memory according to claim 14, wherein said third and said fourth load means are MOS transistors.

16. A semiconductor memory according to claim 14, wherein said third and said fourth load means are resistor elements.

17. A semiconductor memory according to claim 13, further comprising:

power supply nodes for receiving a supply potential; and grounding nodes for receiving a grounding potential;

wherein each of the memory cells in said memory cell array includes:

a first and a second storage node;

a first driver transistor having the gate thereof connected to said second storage node, said first driving transistor being connected interposingly between said first storage node and said grounding nodes;

a second driver transistor having the gate thereof connected to said first storage node, said second driving transistor being connected interposingly between said second storage node and said grounding nodes;

first load means connected interposingly between said first storage node and said power supply nodes; and second load means connected interposingly between said second storage node and said power supply nodes;

wherein said plurality of test memory cells are constituted by a first test memory cell storing first information and by a second test memory cell storing second information different from said first information;

wherein each of said first and said second test memory cells includes:

a third and a fourth storage node;

a third driver transistor having the gate thereof connected to said fourth storage node, said third driver transistor being connected interposingly between said third storage node and said grounding nodes;

a fourth driver transistor having the gate thereof connected to said third storage node, said fourth driver transistor being connected interposingly between said fourth storage node and said grounding nodes; and third load means connected interposingly between one of said third and said fourth storage node on the one hand, and said power supply nodes on the other; and wherein the way in which said third load means of each of said first test memory cells is connected to said third and said fourth storage node differs from the way in which said third load means of said second test memory cell is connected to said third and said fourth storage node.

18. A semiconductor memory according to claim 17, wherein said third load means is an MOS transistor.

19. A semiconductor memory according to claim 17, wherein said third load means is a resistor element.

20. A semiconductor memory comprising:

a memory cell array having a plurality of memory cells arranged in matrix fashion;

a redundant memory cell row for replacing the memory cell row of any row address in said memory cell array;

a test mode memory cell column composed of a plurality of test memory cells associated respectively with the memory cell rows in said memory cell array and with said redundant memory cell row, wherein said test mode memory cell column has one kind of information stored beforehand in the test memory cell associated with said redundant memory cell row, and has another kind of information stored beforehand in each of the test memory cells associated with each row of said memory cell array; and a test mode multiplexer for receiving a test mode signal representing a test mode and for selecting said test mode memory cell column in response to said test mode signal received in said test mode;

wherein, in said test mode, the row addresses of said memory cell array are selected by turns in order to retrieve the information stored in said test memory cells of said test mode memory cell column to check if said redundant memory cell row has replaced any memory cell row.

21. A semiconductor memory comprising:

a memory cell array having a plurality of memory cells arranged in matrix fashion and including more memory cell columns than all selectable column addresses;

column selection switching means for switching the selection status of the memory cell columns with respect to the column addresses depending on whether any defective memory cell exists in said memory cell array, wherein said column selection switching means forms one of first and second status selectively; said first status being selected in the absence of any defective memory cell column and being one in which the memory cell columns are selected to correspond with said column addresses on a one-to-one basis starting from the memory cell column at one end of said memory cell array; said second status being selected in the presence of a defective memory cell column and being one in which, of the memory cell columns selected in said first status, the defective memory cell column and those memory cell columns starting therefrom and located in the direction of the other end of said memory cell array are each replaced by the adjacent memory cell column in said direction of said other end;

a test mode memory cell row composed of a plurality of test memory cells associated respectively with the memory cell columns of said memory cell array, wherein each of said test memory cells making up said test mode memory cell row has previously stored information different from the information stored in the adjacent test memory cells; and a test mode row decoder for receiving a test mode signal representing a test mode and for selecting said test mode memory cell row in response to said test mode signal received in said test mode;

wherein, in said test mode, the column addresses of said memory cell array are selected by turns in order to retrieve the information stored in said test memory cells associated respectively with said column addresses to check if any memory cell column is replaced by said column selection switching means.

22. A semiconductor memory comprising:

a memory cell array having a plurality of memory cells arranged in matrix fashion and including more memory cell rows than all selectable row addresses;

row selection switching means for switching the selection status of the memory cell rows with respect to the row addresses depending on whether any defective memory cell exists in said memory cell array, wherein said row selection switching means forms one of first and second status selectively; said first status being selected in the absence of any defective memory cell row and being one in which the memory cell rows are selected to correspond with said row addresses on a one-to-one basis starting from the memory cell row at one end of said memory cell array; said second status being selected in the presence of a defective memory cell row and being one in which, of the memory cell rows selected in said first status, the defective memory cell row and those memory cell rows starting therefrom and located in the direction of the other end of said memory cell array are each replaced by the adjacent memory cell row in said direction of said other end;

a test mode memory cell column composed of a plurality of test memory cells associated respectively with the memory cell rows of said memory cell array, wherein each of said test memory cells making up said test mode memory cell column has previously stored information different from the information stored in the adjacent test memory cells; and a test mode multiplexer for receiving a test mode signal representing a test mode and for selecting said test mode memory cell column in response to said test mode signal received in said test mode;

wherein, in said test mode, the row addresses of said memory cell array are selected by turns in order to retrieve the information stored in said test memory cells associated respectively with said row addresses to check if any memory cell row is replaced by said row selection switching means.

23. A semiconductor memory for generating a test mode signal, comprising:

power supply nodes for receiving a supply potential;

latch means for latching, in synchronism with the receipt of said supply potential, the output of a first potential having a first logical value; and potential supply means for receiving a write control signal representing a write mode and for supplying, in said write mode and in response to said write control signal, said latch means with a second potential having a second logical value to be latched;

wherein the output signal of said latch means is generated as said test mode signal.

24. A semiconductor memory comprising:

a memory cell array having a plurality of memory cells arranged in matrix fashion;

a redundant memory cell row furnished where appropriate relative to said memory cell array and replaceable with any one memory cell row of said memory cell array;

a redundant memory cell column furnished where appropriate relative to said memory cell array and replaceable with any one memory cell column of said memory cell array;

a test mode memory cell row formed outside the memory cell rows of said memory cell array, said test mode memory cell row being composed of a plurality of test memory cells; and a test mode memory cell column formed outside the memory cell columns of said memory cell array, said test mode memory cell column being composed of a plurality of test memory cells;

wherein said test mode memory cell row is selected in a test mode so as to check if said redundant memory cell column has replaced any memory cell column, and said test mode memory cell column is selected in said test mode so as to check if said redundant memory cell row has replaced any memory cell row.

* * * * *